(12) United States Patent
Smith

(10) Patent No.: US 6,414,610 B1
(45) Date of Patent: Jul. 2, 2002

(54) DATA COMPRESSION

(76) Inventor: Rodney J Smith, 21 Baroda Street, Khandallah, Wellington (NZ)

(*) Notice: Subject to any disclaimer, the term of this patent is extended or adjusted under 35 U.S.C. 154(b) by 0 days.

(21) Appl. No.: 09/367,885
(22) PCT Filed: Feb. 24, 1998
(86) PCT No.: PCT/NZ98/00025
§ 371 (c)(1), (2), (4) Date: Aug. 20, 1999
(87) PCT Pub. No.: WO98/39723
PCT Pub. Date: Sep. 11, 1998

(30) Foreign Application Priority Data

Feb. 24, 1997 (NZ) .............................................. 314289

(51) Int. Cl.[7] .............................................. H03M 7/00
(52) U.S. Cl. ..................................................... 341/106
(58) Field of Search ................... 341/106, 51; 707/532; 345/202

(56) References Cited

U.S. PATENT DOCUMENTS

| | | |
|---|---|---|
| 4,876,541 A | 10/1989 | Storer |
| 5,179,378 A | 1/1993 | Ranganathan et al. |
| 5,298,895 A | 3/1994 | Van Maren |
| 5,339,076 A | 8/1994 | Jiang |
| 5,534,861 A | 7/1996 | Chang et al. |
| 5,537,551 A | 7/1996 | Denenberg et al. |
| 6,047,298 A * | 4/2000 | Morishita .................... 707/532 |
| 6,088,699 A * | 7/2000 | Gampper ..................... 707/10 |

* cited by examiner

Primary Examiner—Brian Young
(74) Attorney, Agent, or Firm—Killworth, Gottman, Hagan & Schaeff, L.L.P.

(57) ABSTRACT

A method of adapting a connection structure forming part of a dictionary in a computer memory device is provided. The structure includes a plurality of interface connections and a plurality of non-interface connections, with each interface connection representing a symbol, and the presence or absence of a chain of non-interface connections in which the symbol is represented, and each non-interface connection representing a relationship between two symbols, two non-interface connections, a symbol and a non-interface connection, or a non-interface connection and a symbol. The method includes determining alternative relationships between pairs of symbols, non-interface connections, and symbols and non-interface connections within the structure, and removing existing non-interface connections from the structure and inserting new non-interface connections into the structure according to relative numbers of occurrences of the alternative relationships within the dictionary.

11 Claims, 26 Drawing Sheets

1201      1203

| a | 103765 |

100586

1202

| s | 176094 |

100594

| e | 105406 |

100602

| o | 116746 |

100610

| t | 154876 |

100618

| d | 103987 |

100626

| m | 118555 |

100634

| u | 200164 |

100642

| c | 219550 |

100650

| n | 198061 |

100666

| y | 254766 |

100674

| p | 219083 |

100682

↓

| 1203 | F1 | F2 | F3 | F4 | F5 | F6 | F7 | F8 |
|------|----|----|----|----|----|----|----|----|
| 0 | 100 | 100594 | 09867 | | | | | |

FIG.12

|  1301  |  1303  |  1304  |  1305  | 1306 |
|--------|--------|--------|--------|------|
| 100650 | 100586 | 476580 | 249586 |      |
| 219550 F1 | F2 | F3 | F4 | |

1302

| 100650 | 100602 | 265498 | 327645 |  |
|--------|--------|--------|--------|--|
| 249586 | | | | |

| 100650 | 100610 | 220499 | 340989 |  |
|------------|------------|------------|------------|--|
| 327645 | | | | |

| 100650 | 100642 | 476650 | 370968 |  |
|--------|--------|--------|--------|--|
| 340989 | | | | |

| 100650 | 100658 | 365485 | 487657 |  |
|--------|--------|--------|--------|--|
| 370968 | | | | |

| 100650 | 100650 | 978605 | 498760 |  |
|--------|--------|--------|--------|--|
| 487657 | | | | |

| 100650 | 100674 | 476586 | 499031 |  |
|--------|--------|--------|--------|--|
| 498760 | | | | |

.
.
.

| 100650 | 100686 | 574601 | 0 |  |
|--------|--------|--------|---|--|
| 536510 | | | | |

FIG. 13

| 13a01 | 13a03 | 13a04 | | 13a05 |
|---|---|---|---|---|
| 101056 | 100650 | 471180 | ........ | 495861 |

219550 F1      F2      F3      F7

13a02

| 194653 | 100650 | 654982 | ........ | 276453 |
|---|---|---|---|---|
495861

| 298600 | 100650 | 204992 | ........ | 340989 |
|---|---|---|---|---|
276453

| 129581 | 100650 | 766504 | ........ | 409684 |
|---|---|---|---|---|
340989

| 319827 | 100650 | 654853 | ........ | 576575 |
|---|---|---|---|---|
409684

| 176225 | 100650 | 786059 | ........ | 698760 |
|---|---|---|---|---|
576575

| 201786 | 100650 | 765864 | ........ | 990316 |
|---|---|---|---|---|
698760

.
.
.

| 326613 | 100650 | 746015 | ........ | 0 |
|---|---|---|---|---|
836510

FIG. 13a

| 1401 | 1403 | 1404 | 1405 | 1406 |
|------|------|------|------|------|
| 100650 | 100586 | 476580 | ... | ... |
| 219550 | | | | |
| 100650 | 100602 | 265498 | 219550 | 327645 |
| 249586 | | | | |
| 100650 | 100610 | 220499 | ... | ... |
| 327645 | | | | |

1402

| | | | | |
|------|------|------|------|------|
| 100650 | 100642 | 476650 | 249586 | 370968 |
| 340989 | | | | |
| 100650 | 100658 | 365485 | 487657 | 498760 |
| 370968 | | | | |
| 100650 | 100650 | 978605 | ... | ... |
| 487657 | | | | |
| 100650 | 100674 | 476586 | ... | ... |
| 498760 | | | | |

1407

| | | | | |
|------|------|------|------|------|
| | | | 0 | 0 |

FIG. 14

| | | | | |
|---|---|---|---|---|
| 237645 | 100586 | 478576 | 243765 | |
220499

| | | | | |
|---|---|---|---|---|
| 327645 | 100610 | 336547 | 260021 | |
243765

| | | | | |
|---|---|---|---|---|
| 327645 | 100666 | 765465 | 276453 | |
260021

| | | | | |
|---|---|---|---|---|
| 327645 | 100682 | 436547 | 327651 | |
276453

| | | | | |
|---|---|---|---|---|
| 327645 | 100634 | 789012 | 378654 | |
327651

| | | | | |
|---|---|---|---|---|
| 327645 | 100618 | 375110 | 419687 | |
378654

.
.
.

| | | | | |
|---|---|---|---|---|
| 327645 | 100674 | | 0 | |
590971

FIG. 15

| SYMBOL | ARRAY LOC. 1 | ARRAY LOC. 2 | ARRAY LOC. 3 | ARRAY LOC. 4 | ARRAY LOC. 5 |
|---|---|---|---|---|---|
| c | 100650 | | | | |
| o | 100650 | 100610 | | | |
| | 327645 | | | | |
| m | 327645 | 100634 | | | |
| | 327651 | | | | |
| p | 327651 | 100682 | | | |
| | 795228 | | | | |
| a | 795228 | 100586 | | | |
| n | 795228 | 100586 | 100666 | | |
| | 795228 | 321098 | | | |
| y | 795228 | 321098 | 100674 | | |
| | 795228 | 678901 | | | |
| | 890123 | | | | |

RECEIVED

| c | o | m | p | a | n | y | |

COMPRESSED

| 890123 | | | | | | | |

DECOMPRESSED

| c | o | m | p | a | n | y | |

2010

| c | o | | m | | p | | a | n | |
|---|---|---|---|---|---|---|---|---|---|

2015

| T1 | T2 | T3 | T4 | T5 | T6 | T7 | T8 | T9 | T10 |
|---|---|---|---|---|---|---|---|---|---|
| 100650 | 100650 | 327645 | 327645 | 327651 | 327651 | 795228 | 795228 | 795228 | 795228 |
| | 100610 | | 100634 | | 100682 | | 100586 | 100586 | 321098 |
| | | | | | | | | 100666 | |
| | | | | | | | | | |

2020

| | | | | | | | | | |
|---|---|---|---|---|---|---|---|---|---|

2030

| y | | | s | t | o | r | e | | |
|---|---|---|---|---|---|---|---|---|---|

2035

| T11 | T12 | T13 | T14 | T15 | T16 | T17 | T18 | T19 | T20 |
|---|---|---|---|---|---|---|---|---|---|
| 795228 | 795228 | 890123 | 890123 | 890123 | 890123 | 100594 | 100618 | | |
| 321098 | 678901 | | 100594 | 100594 | 100594 | 100618 | 100610 | | |
| 100674 | | | | 100618 | 100618 | 100610 | 100909 | | |
| | | | | | 100610 | 100909 | 100602 | | |

2040

| | | | | | | | 890123 | 100594 | 100618 | 100610 |
|---|---|---|---|---|---|---|---|---|---|---|

2050

| | | | | | | | | | |
|---|---|---|---|---|---|---|---|---|---|

2055

| T21 | T22 | T23 | T24 | T25 | T26 | T27 | T28 | T29 | T30 |
|---|---|---|---|---|---|---|---|---|---|
| | | | | | | | | | |
| | | | | | | | | | |
| | | | | | | | | | |
| | | | | | | | | | |

2070

| 100909 | 100602 | | | | | | | | |
|---|---|---|---|---|---|---|---|---|---|

FIG. 20

| 2125 | F1 | F2 | F3 | F4 | F5 | F6 | F7 | F8 |
|---|---|---|---|---|---|---|---|---|
| | 100650 | 100610 | 220499 | 340989 | | 587003 | 309876 | |

439867

| 2130 | F1 | F2 | F3 | F4 | F5 | F6 | F7 | F8 |
|---|---|---|---|---|---|---|---|---|
| | 100594 | 301332 | | 627710 | | 41 | | |

587003

| 2135 | F1 | F2 | F3 | F4 | F5 | F6 | F7 | F8 |
|---|---|---|---|---|---|---|---|---|
| | 100594 | 751460 | | 744318 | | 5 | | |

627710

| 2140 | F1 | F2 | F3 | F4 | F5 | F6 | F7 | F8 |
|---|---|---|---|---|---|---|---|---|
| | 100594 | 100618 | | 816954 | | 23 | | |

744318

| 2145 | F1 | F2 | F3 | F4 | F5 | F6 | F7 | F8 |
|---|---|---|---|---|---|---|---|---|
| | 100594 | 856732 | | 0 | | 12 | | |

816954

2000

| | 201 | 202 | 203 | 204 | 205 | 206 | 207 |
|---|---|---|---|---|---|---|---|
| z | | | | | | | 3 |
| a | | | | | | | 32 |
| p | | | | | | | 15 |
| p | | | | | | | 20 |
| i | | | | | | | 85 |
| n | | | | | | | 61 |
| g | | | | | | | |

2310

| z | | | | | | | 3 |
|---|---|---|---|---|---|---|---|
| a | | | | | | | 32 |
| p | | | | | | | 15 |
| p | | | | | | | 10 |
| i | n | | | | | | 42 |
| g | | | | | | | |

2320

| z | | | | | | | 3 |
|---|---|---|---|---|---|---|---|
| a | | | | | | | 32 |
| p | | | | | | | 8 |
| p | | | | | | | 18 |
| i | n | g | | | | | |

2330

| z | | | | | | | 2 |
|---|---|---|---|---|---|---|---|
| a | p | | | | | | 11 |
| p | | | | | | | 18 |
| i | n | g | | | | | |

2340

| z | | | | | | | 0 |
|---|---|---|---|---|---|---|---|
| a | p | p | | | | | 11 |
| i | n | g | | | | | |

2350

| z | | | | | | | 1 |
|---|---|---|---|---|---|---|---|
| a | p | p | i | n | g | | |

2360

| z | a | p | p | i | n | g | n/a |
|---|---|---|---|---|---|---|---|

FIG. 23

```
...
    movzx  edi, ax                      ;load code word into 32-bit register
       shl  edi,4                        ;convert to offset memory address
       mov  ebx, word ptr [sod+edi+0]    ;access data (load connection field F1 into ebx)
       mov  ecx, word ptr [sod+edi+2]    ;access data (load connection field F2 into ecx)
...
```

DATA COMPRESSION

FIELD OF THE INVENTION

This invention relates to the field of data compression, data decompression, data adaption to a data environment, and to the field of creating, managing and optimizing a data structure and its contents. The invention may also have uses in the fields of data recognition and artificial intelligence.

BACKGROUND OF THE INVENTION

Data compressors read an input stream of symbols and after reading an input symbol or group of input symbols append one or more output codes ("compression code words") to an output stream ("compressed stream"). The output code or group of output codes represent the input symbol or group of input symbols.

An output code may or may not have the same bit pattern as the last-read input symbol. The quantity of input symbols in an input stream may or may not equal the quantity of output codes in a corresponding compressed stream. When the quantity of bits in a compressed stream is less than the quantity of bits in the corresponding input stream compression is achieved. In a given instance, a compressor may or may not achieve compression.

A decompressor reads a compressed stream and after reading one or more codes in a compressed stream transmits a symbol or group of symbols to an output stream ("decompressed stream"). In lossless compression, the bit pattern of a decompressed stream equals the bit pattern of the original input symbol stream.

If the quantity of codes in a compressed stream equals the quantity of symbols in the corresponding input stream, compression is achieved when the average bit length of output codes is less than the average bit length of input symbols. Output codes may be of invariant or varying bit length and the same goes for input symbols.

If the quantity of codes in a compressed stream does not equal the quantity of symbols in the corresponding input symbol stream, compression is achieved when the quantity of bits in the compressed stream is less than the quantity of bits in the input symbol stream. In such a case there may be more or fewer codes than symbols, and in general there are fewer.

Some compression-decompression ("codec") systems compress contiguous repetitions of a repetitions. Other codec apparatus does not encode contiguous repetitions of a symbol but assigns to each symbol a code of bit-length inversely proportional to the frequency of occurrence or anticipated frequency of occurrence of the symbol in the input symbol stream. A further type of codec system builds a dictionary of repeated groups of symbols previously found in the present input stream, and where a further group of symbols in the input symbol stream matches to a group of symbols in the dictionary, the dictionary index of that symbol group or its location in the earlier part of the input stream is output as the compression code word. The rules used to compress an input symbol stream and decompress a respective compressed stream are often referred to as a "compression model".

Codec systems and apparatus may be further characterized as static and adaptive, and static systems use a compression model which is invariant during a compression session and in adaptive systems the model is dynamically modified by the compressor as a function of the symbols encountered so far in the current input symbol stream. Adaptive systems may provide better compression than static systems but not necessarily at lower cost.

For example, when codec systems were first used in computers, computer processing time was very expensive and dictionary-based compression systems typically stored dictionaries for static re-use with later input symbol streams. Today, computer power is much cheaper, and now, typically, adaptive codec systems build dictionaries separately from each input stream which are then discarded after decompression and sometimes after compression. In some cases a dictionary is implicitly embedded in a compressed stream, and in other cases one is transmitted as a header to the transmission of the compressed stream to which it relates.

The objects of codec systems are reduction of information storage space, reduction of information transmission time, and consequent reduction of information processing cost.

Codec systems now common in personal computing may achieve these objectives, increasing available disk space and decreasing data transmission time from disk surface to application program. Furthermore, while digital images typically occupy more storage space than their analog couterparts, compressed digital images may occupy less space and achieve shorter transmission times, and this has important implications in digital storage and transmission over telephone links of motion pictures, which are a sequence of still images.

In order to achieve acceptance in a market place, a codec system typically must meet certain standards compared to its competitors. It should have good compression and decompression speeds, which are a function of the times required for compression and decompression. It should have a high compression ratio, which is a measure of how much space or transmission time is saved as a consequence of compression. It should be capable of adapting to different data environments, which means taking into account changes in the general qualities of data previously received, and increasing speed and compression ratio accordingly. And a lossless codec system must be reversible, which means that the bit pattern of a decompressed stream must be identical to the bit pattern of the respective input symbol stream.

Prior codec systems exist which exhibit the characteristics mentioned above, however, prior dictionary-based codec systems typically build a dictionary in respect of a current input stream which might be one file or one archive or one session, and discard the dictionary after the respective compressed stream is decompressed or even after compression. This has the disadvantage of failing to compress groups of symbols which occur infrequently in the current input stream but which are commonly repeated in input streams in general.

Furthermore, such methods have the disadvantage of failing to compress groups of symbols which typically occur infrequently in input streams in general but which typically do occur in input streams, and when a number of input streams are considered together as a block, do occur frequently within a block.

Moreover, because the adaptivity of prior codec systems typically applies in respect of a current input stream, such systems cannot optimize compression in a network environment where there are many input symbol streams, and where optimization requires identifying and adapting to repeated symbol groups amongst the network traffic as a whole, and retaining and adapting to such information over time.

In addition, prior lossless codec systems typically encode all information in an input symbol stream into a compressed stream or compressed stream plus compression header, and transmit all such information together. Such transmissions contain the entire information content of the original input symbol stream. If the transmission is intercepted and the codec algorithms known, guessed or discovered then the intercepted transmission may be decompressed and the original symbol stream recovered. This is not ideal in today's sensitive business world. It would be better that some information in an original stream were not transmitted in the corresponding compressed stream. This would partly or completely prevent unauthorized decompression where only the compressed stream is in the possession of an interceptor. Were such absent information to change in character and quantity in an unpredictable way over time, and were such changes to be unique both in content and in manner of change to a given network, this would be even more advantageous in a competitive commercial world.

It is held that to store, update and re-use a dictionary would render a codec system uncompetitive, as stored dictionary entries would not be typical of input streams in general and the average compression ratio would suffer, and if the stored dictionary entries were typical of input streams then the dictionary would be so large that the time required to match a given input symbol group or decompress a given code word would increase processing time unacceptably. Moreover it is held that because of the large size and correspondingly slow compression and decompression speeds of such a dictionary, real-time compression and decompression over a communication link would not be practical.

It is argued, furthermore, that such a dictionary because of its large size could not cost-effectively be transmitted with the compressed stream, and therefore exactly the same dictionary should necessarily pre-exist at each end of a transmission, and this is not ideal.

It is generally asserted by those skilled in the art that there are limits to the ability of codec systems to increase network communication bandwidth, and that this limit now has been reached.

No known prior compression system uses a dictionary which adapts to and retains dictionary content from a plurality of input streams, which may be used interactively in real time over a communication system, and which overcomes the present perceived limitation to the bandwidth of information transmission.

In the field of hand writing, image, voice and other forms of data recognition, which is part of the field of artificial intelligence, relatively large amounts of information are stored in a compressed form and a match or approximate match is sought between an instance of a data type, for example, an image, and the stored information. Prior data type recognition systems have in general not proved to be fast.

SUMMARY OF THE INVENTION

The present invention goes some way towards overcoming the failures of the codec systems described above and provides a relatively fast and reversible codec method, apparatus and data structure with a persistent, resident, broadly adaptive dictionary, with optional supplementary dictionary. The dictionaries may be built from a plurality of input streams and optionally previously compressed streams, and may be employed in batch mode or real time over a communication system to compress and decompress information. The invention may be employed in the field of artificial intelligence, including data recognition, where data is retained in compressed form. When so employed, the present invention provides relatively fast access to compressed data in many cases.

In one aspect the invention provides a method and system for adapting a connection structure forming part of a dictionary in a computer memory device, and a method for adapting the entire dictionary.

In a further aspect the invention provides a method of enabling compression and decompression of symbol streams transmitted between two or more devices, such as a server and client devices in a network. A system including the devices is also provided.

In another aspect the invention provides a method and system for creating a dictionary for use in compression or decompression, by adapting the dictionary by way of additive or change related processes.

In a still further aspect the invention provides a dictionary containing both linked lists and binary search lists. In a yet further aspect the invention provides a method of operating a shift register for greater processing speeds as dictionaries are accessed.

Further aspects of the invention will become evident from the accompanying detailed description and drawings.

By way of example of compression, when an input stream of symbols which contains an instance of such a symbol group is received for compression, the index of the group, which is typically the address of the connection in the dictionary which represents the group, is stored or transmitted as the compression code word. For example, if the symbol group "ing and" is received and it is represented in the dictionary at connection address 12345, and no larger input symbol group is found in the dictionary which includes the symbol group "ing and", then the number 12345 is transmitted as the respective compression code word. In the preferred embodiment, a connection address is a shifted virtual memory offset from near the start of the dictionary.

The present invention may be used in a variety of ways whose primary utility may not be limited to or may not relate to those described herein. The purpose or use of the present invention is therefore expressly not limited to the purpose and use exemplified in the present embodiment. The purpose and use of the present invention may form a sub-process of a further purpose and use including the purpose and use of data recognition systems.

BRIEF DESCRIPTION OF THE DRAWINGS

The above described advantages and operation of the present invention will be more fully understood upon reading the following description of the preferred embodiment in conjunction with the drawings, of which:

FIG. 12 illustrates the contents of part of a dictionary, specifically a number of connections which represent symbols.

FIG. 13 illustrates the contents of part of a dictionary, specifically a number of connections which constitute the linked list primary chain associated with the interface connection which represents the symbol "c".

FIG. 13a illustrates the contents of part of a dictionary, specifically a number of connections which constitute the linked list secondary chain associated with the interface connection which represents the symbol "c".

FIG. 14 illustrates a primary chain consisting in connections related as a binary search tree as an alternate chain structure compared to the linked list chain structure illustrated in FIG. 13.

FIG. 15 illustrates the contents of part of a dictionary, specifically being a number of connections which constitute part of the linked list primary chain associated with the connection which on decompression yields the symbol group "co".

FIG. 20 illustrates the contents over time of a processing column, the received parts of an input stream, and a compressed stream resulting from the operation of the compressor using said processing column and said input symbol stream, and represents a variation on the method illustrated in FIG. 17.

FIG. 23 illustrates part of the process of adaption by change.

DESCRIPTION OF THE INVENTION

As required, a detailed embodiment of the present invention is disclosed herein; however, it is to be understood that the disclosed embodiment is merely exemplary of the invention, which may be embodied in various forms. Therefore specific structural and functional details disclosed herein are not to be interpreted as limiting, but merely as a basis for the claims and as a representative basis for teaching one skilled in the art to variously employ the present invention in virtually any appropriately detailed structure.

The present invention includes by way of reference the invention described in the patent specification of the present inventor published as WO 97/17783.

Structure

Figure 21:
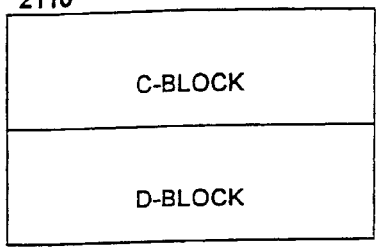
FIG. 21 illustrates the memory blocks referred to herein as the c-block and the d-block; and the structure of a connection in the d-block 2125 and its associated primary chain in the c-block.

A data compressor compresses an input stream of symbols by first matching groups of such symbols to entries in a dictionary in which information is stored in a structure of chains which each in turn consists in a structure of connections FIG. 21, 2125 which each in turn comprises a set of addresses and optionally other data. Chains are illustrated in FIG. 13, FIG. 13a, FIG. 14 and FIG. 21.

Connection Blocks

Figure 1:
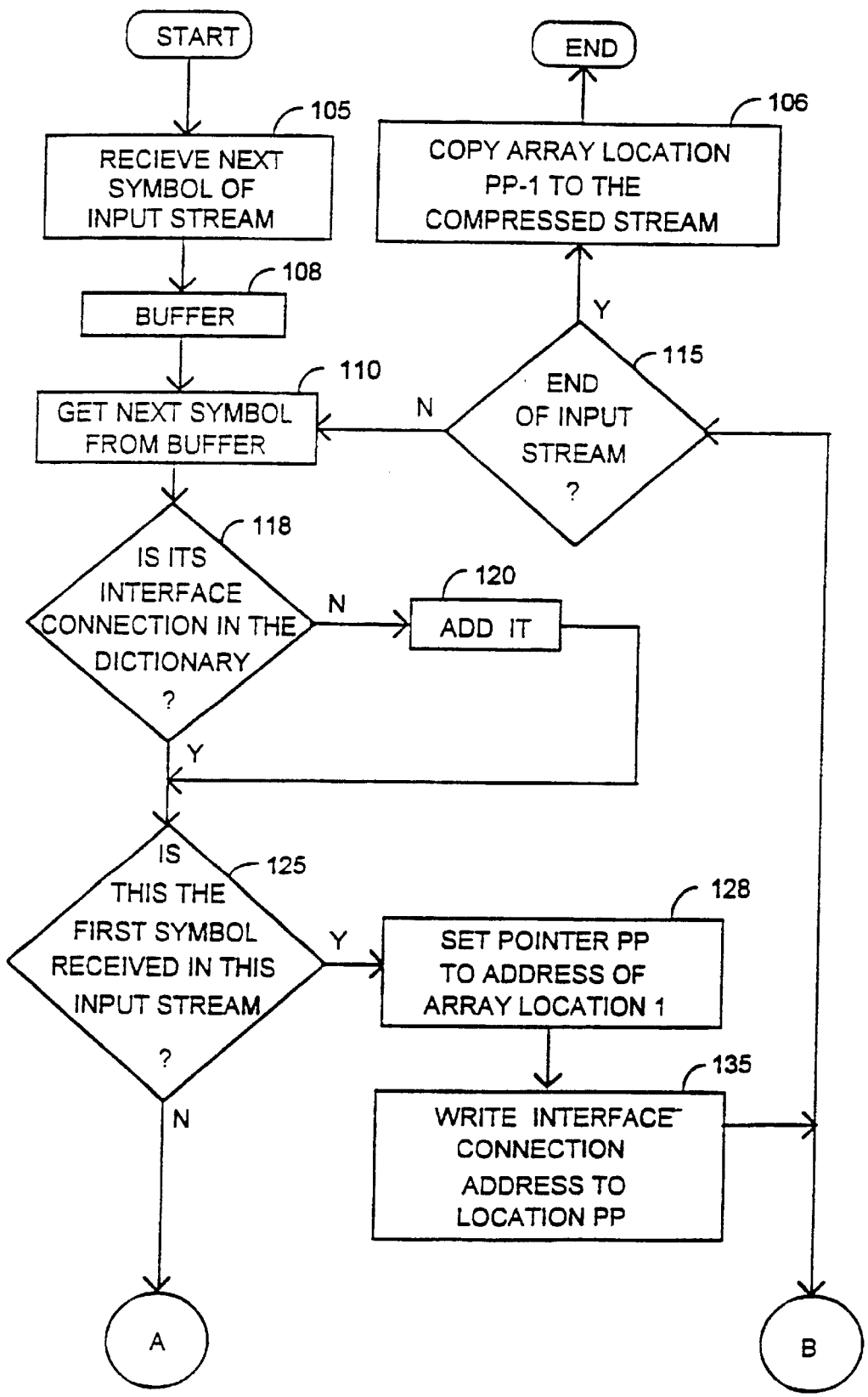
FIG. 1 and FIG. 2 form a flowchart illustrating the compression process.
Figure 2:
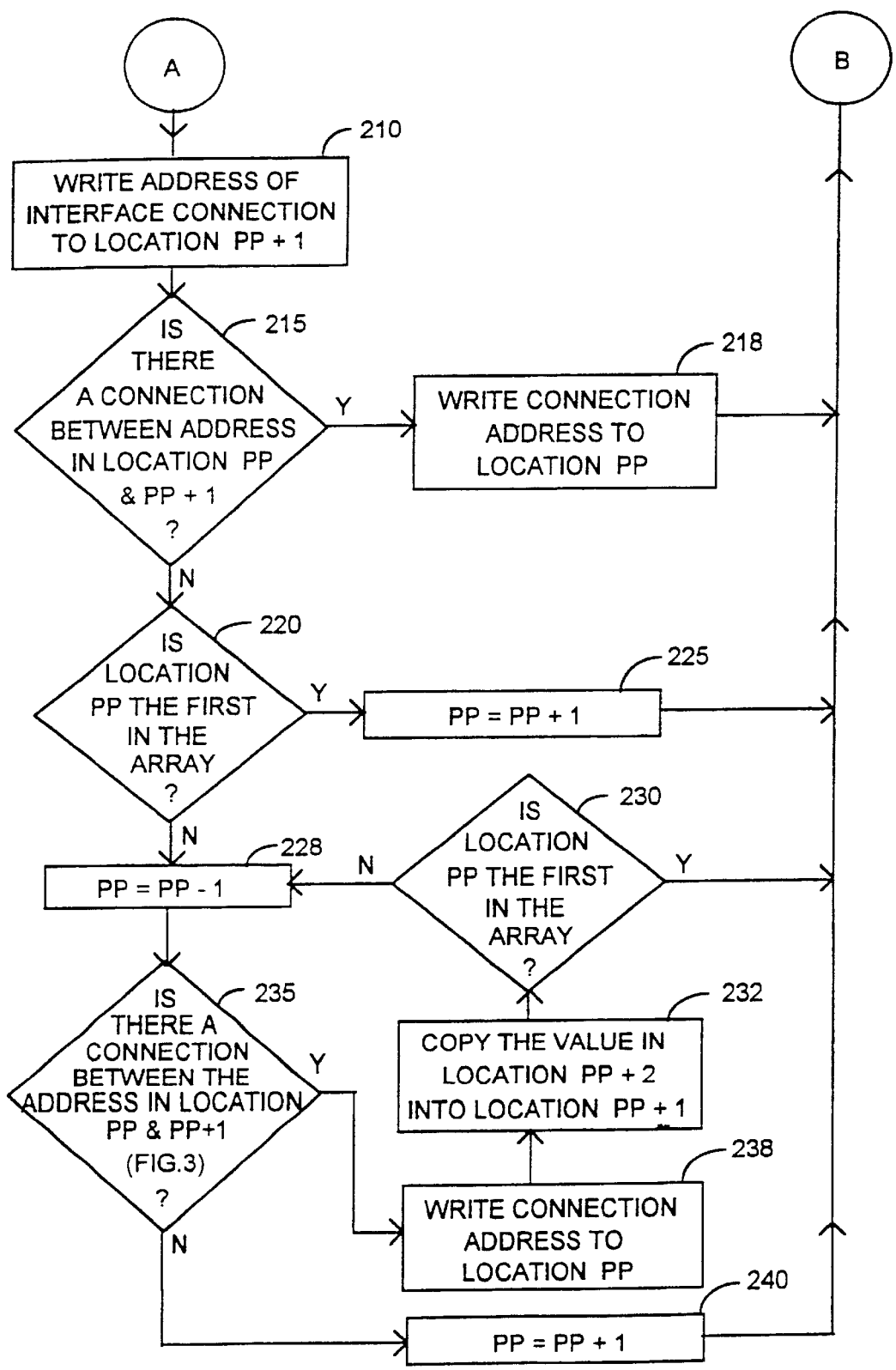
Figure 3:
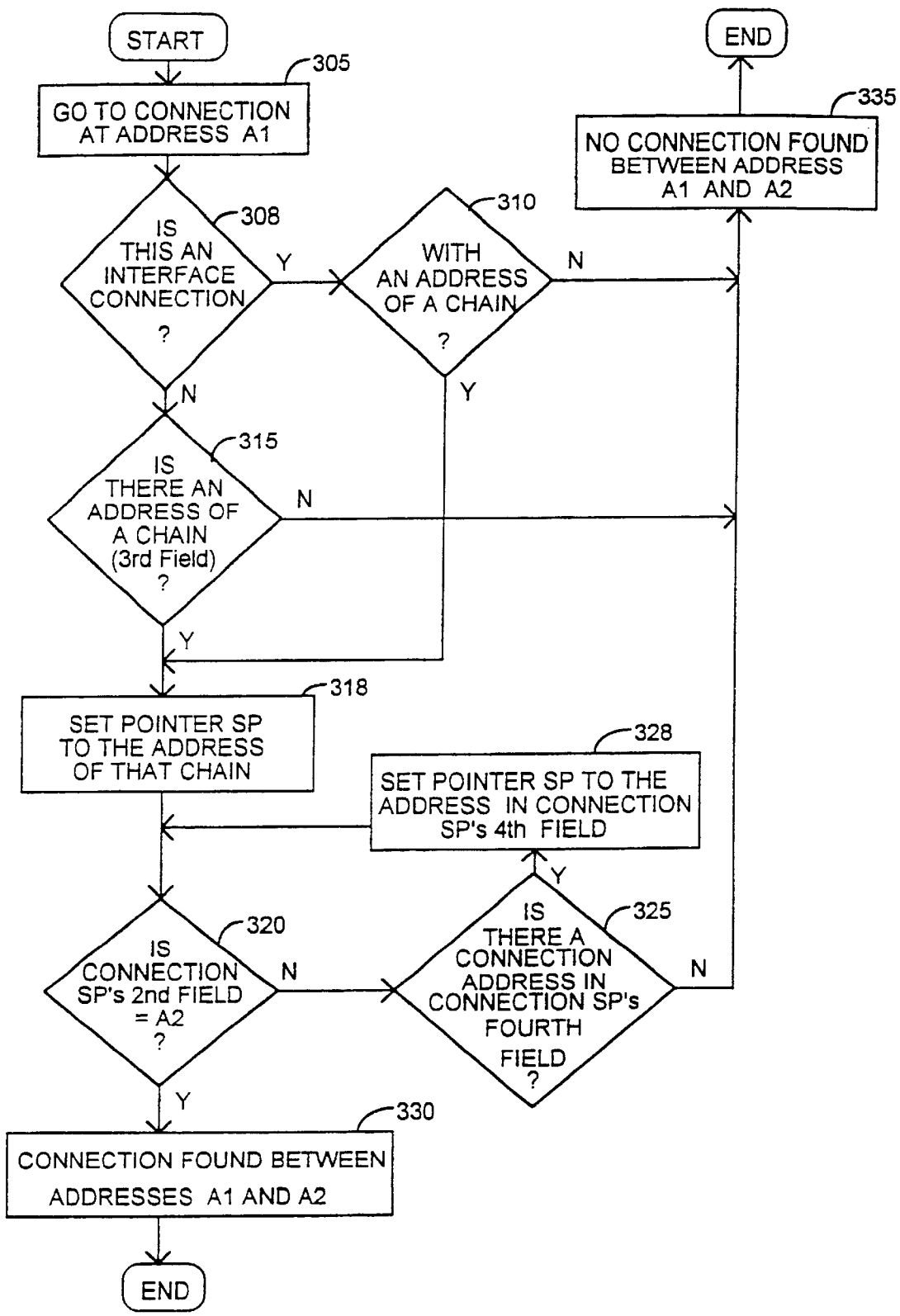
FIG. 3 is a flowchart illustrating the method within the compression process of finding a connection.
Figure 4:
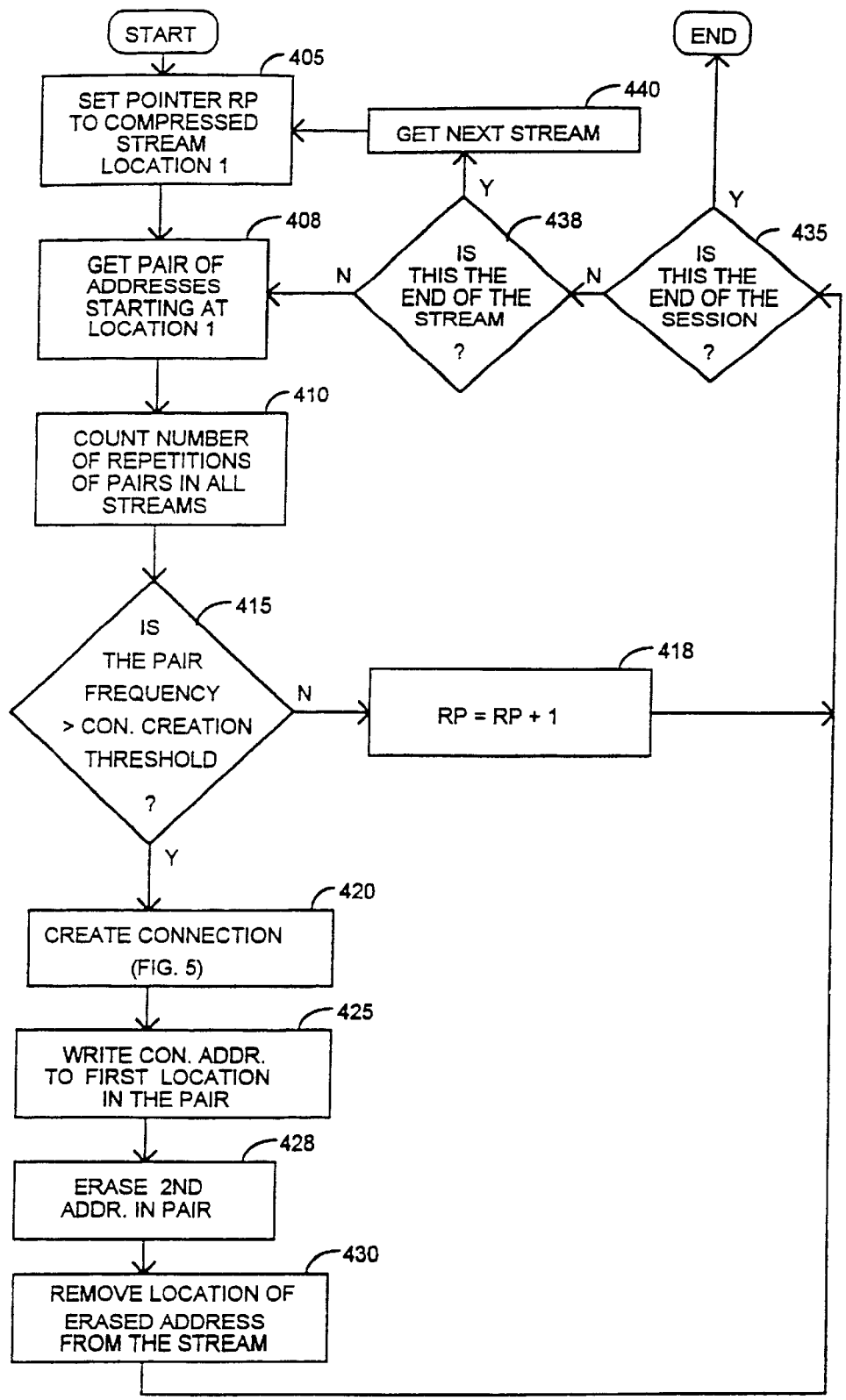
FIG. 4 and FIG. 5 are flowcharts illustrating the adaption by addition process.
Figure 5:
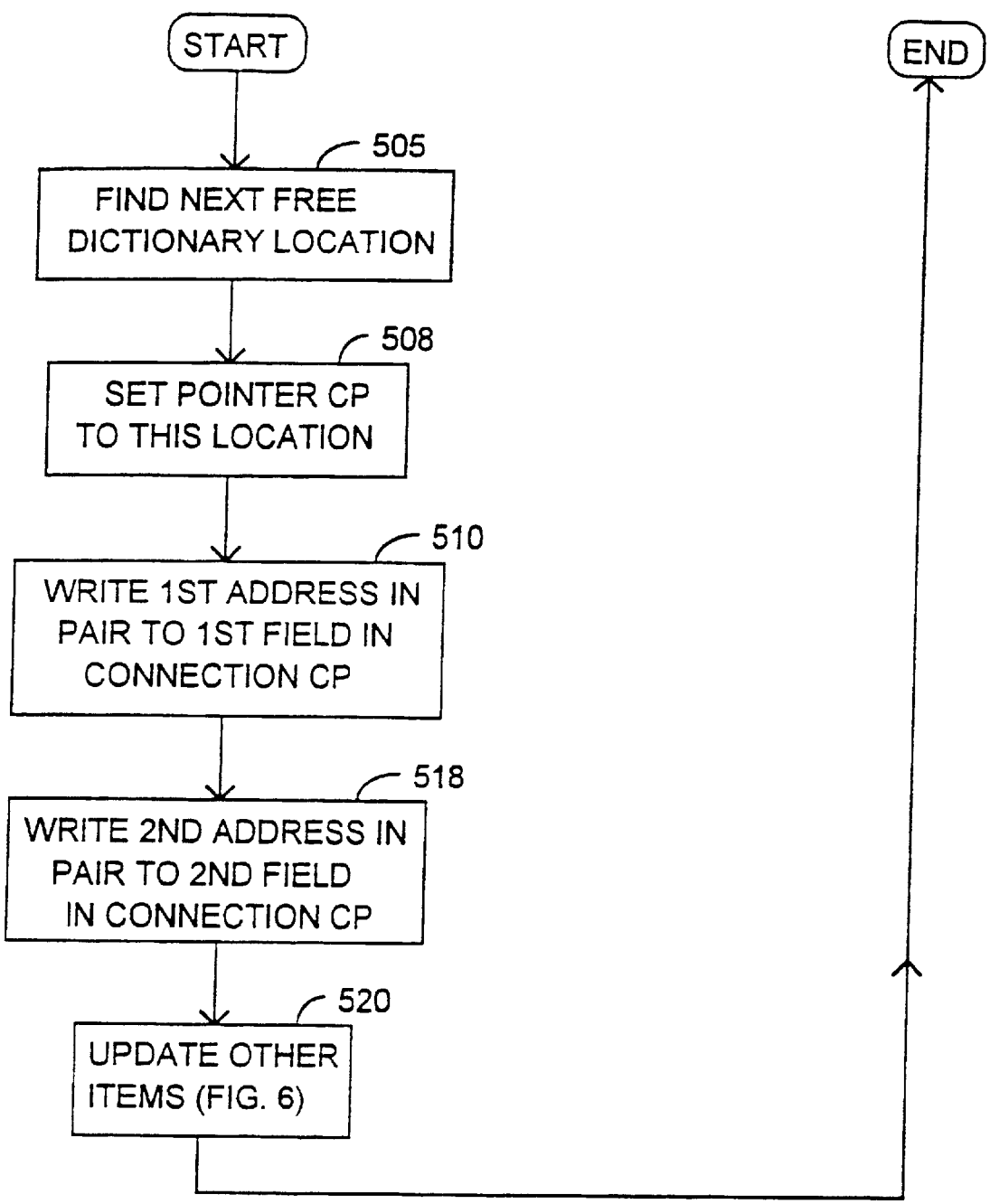

Referring now to FIG. 21, an implementation of the present invention may use memory in a way conveniently conceptualized as two separate memory blocks 2110, where one such block contains the connections in which the dictionary consists 2110 D-BLOCK and which persist over a greater period of time, and the other contains other connections which are not part of the dictionary 2110 C-BLOCK and which are created and updated during compression, analysed during adaption by addition, and then discarded. Compression is described in detail below and is illustrated in FIG. 1, FIG. 2 and FIG. 3. Adaption by addition is described in detail below and is illustrated in FIG. 4 and FIG. 5. Where it is relevant to identify in which such block a connection or other structure resides, the name herein of the structure may be prefixed by "c-" or "d-" accordingly; for example, c-connection, d-connection, d-chain, c-chain.

Chain

A chain is a set of connections related as a certain data structure 2125–2145. A chain may be a primary chain FIG. 13, FIG. 14, FIG. 21 or a secondary chain FIG. 13a. Chains may exist in the d-block and in the c-block. A chain may contain one or more connections 2125–2145. A chain in the d-block may contain connections only in the d-block and chains in the c-block may contain connections only in the c-block.

A connection is a data structure which in the preferred embodiment herein contains an ordered pair of addresses, (being the addresses of the locations of the two items which are connected) which addresses are stored in the preferred embodiments in the first field 2125-F1 and second field 2125-F2 of a connection. Connections are described in detail below. An address is described in detail below.

A primary chain 2125–2145 consists in all those connections whose first address F1 of the said ordered pair is the same. In an embodiment where the first address of such an ordered pair is omitted from some or all connections, a primary chain consists of all those connections which would have the same first such address were that address to be present in those chains. A secondary chain is the same as a primary chain except in that it contains all the connections which have the same value in their second address fields FIG. 13a, F2.

Structure of a Chain

The connections in a chain may be related as a linked list (an "ll chain") FIG. 13. To find a particular connection in such a chain a codec process sequentially travels through the linked list until the sought connection is found or the end of the list is reached. In FIG. 13 the connection at address 536510 which is the bottom connection illustrated in that figure is the last connection in the list.

A chain may be structured in other ways, including as a binary search tree (a "bst chain"). A bst chain is illustrated in FIG. 14. To find a particular connection in a bst chain a codec process executes a binary search of the binary search tree until the sought connection is found or a leaf node is found. In FIG. 14 the connections at addresses 21950, 327645, 487657 and 498760 represent leaf nodes.

When connections in a chain are related as a linked list, one field in the connection structure of such connections is used to record the address of the next connection in the list 2125–2145, F4. When connections in a chain are related as a binary tree, two fields in the connection structure of such connections are used to record the address of the respective left branch and right branch. FIG. 14 illustrates a bst chain including a left branch 1405 and a right branch 1406.

Alternatively, access to the connections within a chain may be affected via the creation and maintenance of a separate lookup table or hash table in which the addresses of chains and addresses of constituent connections are identified. In the case of a lookup table, such a table may be sorted then subject to access methods including a binary search. In the case of such a table, a chain or its constituent connections may be accessed by looking up or calculating the address of a connection in such a table.

In the case where a chain is structured as a tree, the address of the chain FIG. 14, 1402 is considered to be the address of the top connection in the tree (the root node). When a chain consists in connections related as a linked list, the address of the chain is considered to be the address of the first connection in the list FIG. 13, 1302. In the case where such a list is a circular list, the address of the list is typically considered to be the address of the original connection in the list.

The optimal structure of a chain is dependent on factors such as the number of connections in a chain, and this in turn may vary from one dictionary to another or within a dictionary. A dictionary may have one only type of chain structure; the type of chain structure in a dictionary may adapt dynamically over time changing from one type of structure to another; or different types of chain structures may exist together in the one dictionary at the one time.

As an example of the last case, chains with few connections may be structured as linked lists, and ones with larger quantities of connections may be structured as binary search trees, and such dictionaries which support mixed chain access modes may provide shorter overall access times. In such a case, where the quantity of connections in a chain surpass a threshold value a linked list chain FIG. 13 may be re-structured into a bst chain FIG. 14 by a housekeeping function of the present invention.

Structure of a Connection

Referring now to FIG. 21, a connection is a set of fields with particular characteristics in or at which data may subsist, and typically such fields are considered to be but are not necessarily contiguous 2125 F1–F8. A field is described in detail below. Such fields together with their characteristics are called the "connection structure".

The address of the first field in a connection 2125, 439867, or a shifted function of this address from which this address may be re-created, is considered to be the address of the connection. For example, if a connection structure is 16 bytes long then a connection address may be taken to be the virtual memory offset address of the first field in the connection, shifted right by four bits. Such a method has advantages both for decompression-compression speeds and code word size. A virtual memory offset address may be rebuilt be shifting left a connection address by four bits. This reduces the size of unique connection identifiers, and provides a fast means of obtaining a connection's virtual memory offset address and reading or writing a value located there.

The minimum number of fields in a connection is three 2125 F1–F3, and there are typically between four and eight and there may be more in an embodiment of the present invention.

A connection 2125 conceptually connects two other connections FIG. 12 "c" and FIG. 12 "o". A connection is said to have a direction, which is from the first such other connection connected to the second. A primary chain FIG. 13 consists of all the one or more connections which connect the same first other connection. An optional separate and co-existing chain in respect of a same connection consists in all the one or more connections which connect the same second other connection ("secondary chain") FIG. 13a. In this manner a connection may at one and the same time be a member of two separate chains.

In the preferred embodiment described herein the address of the first such other connection is stored in the first field of the current connection 2125 F1 and the second field of the current connection is used for the address of the second such other connection 2125 F2.

Interconnection Structure

Figures 16, 17:
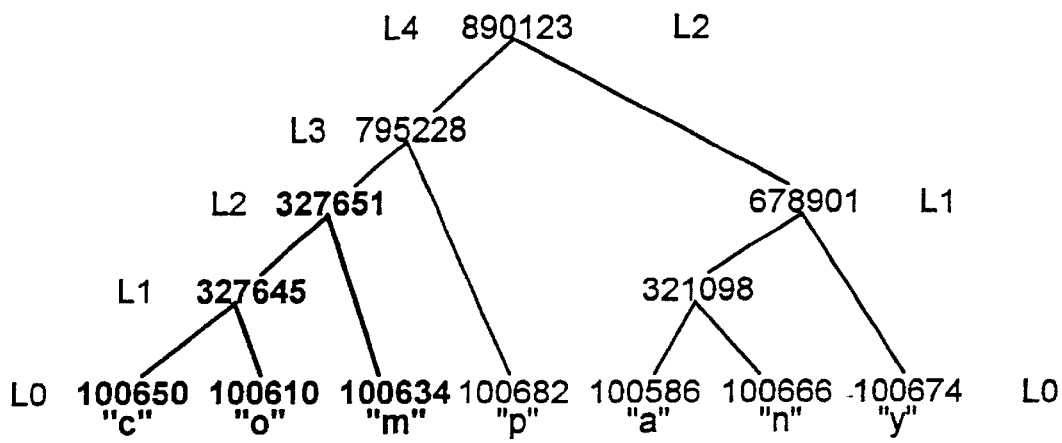
FIG. 16 illustrates a structure of connections which yields on decompression the symbol group "company". The parts printed in bold face relate to parts of FIG. 12, FIG. 13, FIG. 14, and FIG. 15, printed in bold face.
FIG. 17 illustrates the contents over time of part of a processing array. The rows relate to the compression of input symbols over time, and the second and subsequent columns to the contents of processing array locations.

Referring now to FIG. 16, connections are related to each other in two types of structures. Firstly, they are related as members of a chain as described elsewhere herein, which might be a primary chain or a secondary chain, and a connection might be a member of a primary chain and also might be member of a secondary chain.

Secondly, connections are related in a data structure called an "interconnection structure". FIG. 16 illustrates an interconnection structure. An interconnection structure has the graphical form of an inverted tree. An interconnection structure has one connection at the apex (the "apex connection") 890123 and interface connections at the bottom 100650, 100610, 100634, 100682, 100586, 100666, 100674. Interface connections are described in more detail below.

The address of an interconnection structure is considered to be the address of its apex connection. Branchings occur at connections on levels L1–L4 above the bottom level L0. Levels are described in detail below. An interface connection is considered to be an interconnection structure consisting in a single connection, and it is both an apex connection and a connection representative of and mapped to a symbol.

Text Symbols

Where symbols are text characters and an input symbol stream is language text, it should be noted that an interconnection structure will not necessarily represent (decompress to) meaningful words. A connection may and typically would be formed between two other connections which, taken together, decompress to a common suffix of one word, such as "ing", a space, and a common prefix of a following word, such as "an". This is because the present invention does not use delimiters, and symbol groups such as "ing an", where a symbol stream is English text, typically occur more frequently in English text than do the contiguous words in the symbol stream of which "ing" and "an" are the respective trailing and leading parts.

Levels

Connections at different heights in an interconnection structure are said to reside on different levels L0–L4. The lowest-numbered level L0 is at the bottom of the structure and consists of interface connections, while the highest level is at the top and contains only the apex connection 890123. The number of levels between an interface connection and the apex connection of a given interconnection structure may vary according to which interface connection within the interconnection structure is taken as a starting point for counting levels.

Fields

Referring now to FIG. 21, fields are places where information may reside F1–F8. Such information may include addresses, flag registers, symbols, and other data. Fields consist of one or more locations. The address of the first location in a field 2125, 439867 is considered to be the address of the field. Fields within a connection may be referred to with the notation Fn where n>=1 and where n represents the position of the field in the connection starting at the first field which is called field number 1, or F1. The order fields with particular purposes take in a connection is entirely arbitrary, given that the codec algorithms which use those fields do so correctly according to the type and purpose of their contents.

Addresses

An address may be a physical or virtual memory address, a pointer to such, an index, an address offset, a segment-offset address combination, a disk location identifier, or other identifier of a place or location, or a set of physical coordinates, and these are all means of identifying the location of an object in a structure.

Symbol Mapping

Referring now to FIG. 12, certain connections represent, or are mapped to, input symbols. A dictionary holds a single representation of each qualitatively different symbol received in the past, and some embodiments of the present invention may require that all possible qualitatively different symbols are so represented in a dictionary. A symbol is represented in or mapped to a dictionary as a special type of connection 1203.

Interface Connections

Unlike other connections, a connection to which a symbol is mapped does not connect further connections 1203-F1, and therefore does not contain in its first and second fields addresses of such further connections. Such a symbol-mapped connection may be thought of as representing a connection between a dictionary and an item outside a dictionary, and for this reason is called an "interface connection". The lowest level of an interconnection structure consists of interface connections. Interface connections may be created during initialization of a new dictionary, or they may be added after input symbols are encountered in input streams which symbols are not represented in the dictionary. Interface connections may be considered to belong to the same primary chain, which may be the first primary chain in a dictionary.

Symbol Mapping Scheme

The manner in which symbols map to interface connections is called a dictionary's "symbol mapping scheme". In the embodiment described herein, an interface connection has a special value in its first field, and the value in its second field identifies its respective symbol. Interface connections are part of a single chain which starts with the first connection in the dictionary. Symbols may be mapped to respective connections in other ways, including placing such connections in an order which corresponds to the position of the symbol in an ordered sequence of the respective symbol set. For example where symbols are one-byte symbols, the first 256 connections in a dictionary may map ordinally to the 256 values of the symbol set. Or a lookup table may be employed which indexes symbols to connections within a dictionary, or other means may be employed to the same end.

Creating Interface Connections During Initialization

Symbols may be mapped into a dictionary during an initialization phase of a newly-created dictionary where part or all the symbol set might be represented as newly-created respective interface connections. And the respective connection of each such symbol may be represented sequentially from at or near the start of a dictionary thereby facilitating access, or may be positioned in other places in a dictionary.

Interface Connection—First Field Value

In the preferred embodiment of the present invention the first field in an interface connection has a special value which is not an address inside a dictionary, and which is the value binary zero 1203-F1.

Interface Connection—Second Field Value

In the preferred embodiment of the present invention the second field in an interface connection 1203-F2 is indicative of the symbol to which that connection is mapped and which that connection represents. To this end, the field may contain that symbol or its numerical equivalent or may represent that symbol in some other manner. In the case where a symbol is an ASCII character, the second field may contain the numerical ASCII value of the respective symbol. In this example, in order to find the interface connection which represents a particular symbol, the codec system searches the chain which contains all interface connection in the same manner as it searches other chains. That is, the codec system seeks to match a search key, which in this case is the numerical ASCII value of a symbol, to the value contained in the second field of the connections in the said chain. FIG. 12, 1203 illustrates the connections which represent the ASCII symbols "c". ASCII "c" has the ASCII decimal value 99, which is the 100th ASCII character 1203-F2.

Interface Connection—Other Field Values

The purpose and use of the first and second fields of an interface connection varies from the use of the first and second fields in non-interface connections. The purpose and use of the other interface connection fields 1203 F3–F8 are the same as those of non-interface connections.

Connection Fields in Detail

The purpose and use of fields in connections in general are now outlined. In an embodiment of the present invention designed for better decompression speed, a connection contains at least four fields for addresses 1203 F1–F4 and one or more additional fields for other information such as flags for use by one or more of the various codec processes.

In the current embodiment, connection fields one and two are allocated for the addresses of the two other connections which the current connection connects 1203-F1, 1203-F2; a third field 1203-F3 records the address of the respective primary chain in the next level up, if any (the "associated primary chain"); and a fourth field 1203-F4 provides for the address of the next connection, if any, in the current primary chain on the same level (the chain if any of which the current connection forms a part), where such chain consists in a set of connections related as a linked list. Where such chain is a bst chain, fields four 1203-F4 and five 1203-F5 are for the addresses which constitute the left and right branches respectively. An example of a number of connections forming a linked list chain is shown in FIG. 13 and FIG. 13a. A bst chain is illustrated in FIG. 14.

Field six 1203-F6 of a d-connection is used for the address of the associated primary c-chain, if any. Field seven 1203-F7 is used for the address of the next connection in the secondary chain, if any; and where the secondary chain is a bst chain fields seven 1203-F7 and eight 1203-F8 are used for the addresses of the connections which are its left and right branches respectively, if any. A field nine, which is not represented in FIG. 12 may be used for the address of the associated secondary d-chain, if any, although in some cases as described elsewhere herein, field five or field eight may be used for this purpose.

Connection—First Two Fields

The first two fields of a current connection are used to record the addresses of the other two connections which that current connection connects; that is, between which the connection relationship exists. For example, if one connection when decompressed yields the symbol group "speak", and if another connection group when decompressed yields the symbol group "ing" and if those two respective symbol groups or their respective connections are identified as repetitions in that order in respect of which a new connection may be created in a dictionary, then such new connection shall have in its first field the address of the connection which when decompressed yields the symbol group "speak", an the second such field shall contain the address of the connection which when decompressed yields the symbol group "ing"; and that new connection when decompressed shall yield the symbol group "speaking".

Connection—Third Field

The third field in a d-connection in the present embodiment is used for the address of the primary d-chain on the next level up, if any (which is called the "associated primary d-chain"). And third field in a c-connection in the present embodiment is optionally used for the address of the primary c-chain on the next level up, if any (which is called the "associated primary c-chain").

Typically, dictionaries contains fewer chains than connections, and rather than a chain subsisting as a linked list or binary search tree, the third field in a connection may index to a lookup table or hash table of chain addresses and or the addresses of connections within each such chain, and such third field may be of smaller size than the field used to record connection addresses.

Connection—Fourth (and Fifth) Field

Connections in a chain may be related in different ways including as a linked list or as a binary search tree. When related as a linked list, only one field is required in order to identify a connection as part of a respective chain. When linked as a binary search tree, an additional field is needed since both left and right branches must be identified.

Alternatively, other ways may be employed to relate connections in a chain, including using the fourth connection field as an index into a lookup table or hash table of the addresses of the connections in that chain.

Alternate Three-field Interconnection Structure

In an implementation of the present invention designed for smaller dictionary size, a connection may contain three fields for addresses, rather than four (or more) as described above, assuming linked list chains. In respect of such an embodiment, the first second and third fields in such a three-field connection perform the same function and are for the same purpose as the second, third and forth fields in the four-field embodiment described above.

In the four-field interconnection structure described above, the first field of each connection in a chain contains the same address. This provides good decompression speeds, as the decompressor can read from any given connection the address of the associated connection on the next level down in the respective interconnection structure. However, that address of the associated connection may be held elsewhere and the first field of the four-field interconnection structure removed (at least in respect of all but one connection in a chain).

In such a case, the address of the connection associated with a chain may be held once only, and one connection in a chain, for example, the first or top connection in a chain, may contain an extra field (or retain the first field) for this purpose. During decompression a decompressor would search a chain for that one connection with such extra field, read the address in that field, and then use that address for the same purpose as the first address in the four-field interconnection structure. Where dictionary size is a more relevant consideration, such a three-field implementation may be preferable.

Connection—Sixth Field

The sixth field of a d-connection 1203-F6 in the present embodiment is used for the address of the primary c-chain, if any, in the c-block, if any (which is called the "associated c-block primary chain").

Connection—Seventh (and Eighth) Field

A connection may at the one time be a member of two independent chains—a primary chain and a secondary chain. The position of a connection in a primary chain is provided by the value of F4 in the case of ll chains, and F4 and F5 in the case of bst chains. Such a primary chain is the set of connections each of which has the same F1 value.

The position of a connection in a secondary chain is provided by the value of F7 in the case of ll secondary chains, and F7 and F8 in the case of bst secondary chains. Such a secondary chain is the set of connections each of which has the same F2 value. Secondary chains may be used when adapting a dictionary by change and at other times for other purposes. The process of adapting a dictionary by change is described in more detail elsewhere herein.

Connection—Ninth Field

In the case where c-connections are implemented with secondary chains then a nineth field of d-connections may be used for the address of the associated c-block secondary chain.

Stack/Processing Array

Different data structures may be variously employed as temporary work places for the temporary recording of addresses and other data during codec operation including compression, decompression and adaption. Such a structure called herein a "processing array" is used in the present embodiment. Alternatively or in combination, a stack, which is a type of processing array, may be employed in achieving the same results, and in an embodiment of the present invention the CPU stack or stacks may be used.

Compression

A compressor iteratively searches a dictionary for a connection which when decompressed yields a symbol group which matches to the current input stream symbol group ("matching connection"), and when found, adds the next symbol in the input stream to the current input stream symbol group and executes the next match iteration. After a matching connection is not found, a compressor transmits the index, or dictionary address, of the last-found matching connection as an output code ("compression code word"), and starts a new current input symbol group comprising the last symbol of the previous current input symbol group and the next symbol in the input stream (the search process in respect of a current input symbol group may be limited by a control variable which sets the maximum size of such a group). When such a connection is found, the compressor looks at the value in the field in the connection which is reserved for the address of the primary chain on the next level up in the dictionary which is F3 in the preferred embodiment. When a valid such chain address is present, the compressor goes to that address.

Decompression

Each code word in a compressed stream indexes to (is the address of) a dictionary connection, and a compressed stream is decompressed by decompressing each such connection, which each yield a new instance of the original respective input stream symbol group.

Adaption

Optionally, a dictionary may adapt. There are two types of adaption: adaption by addition and adaption by change ("optimisation"). In adaption by addition, new connections are added to a dictionary. In adaption by change, the structure of an interconnection structure is changed.

Housekeeping

Housekeeping functions maintain the integrity and efficiency of a dictionary and include balancing binary tree structures of bst chains, if any; and maintaining certain codec parameters such as the EOD (end of dictionary pointer) and free connection list ("FCL") if any. A binary search tree structure of a chain is balanced when its branches are related in such a manner as to approximately minimize the average binary tree search time of that tree.

Multiple Dictionaries

More than one dictionary may be available to a compressor or decompressor, and one or more supplementary dictionaries may be transmitted with a compressed stream. In the case of a decompressor, a command prefix embedded in the compressed stream is identified by the decompressor and the command actioned. In this case the command is the command to change dictionaries, and the command argument identifies the dictionary to change to.

In the preferred embodiment, embedded commands have the format: command prefix (word of value binary zero), command name (word of value, in this case "CD"), command argument (word of value, in this case a binary number which identifies the dictionary to change to). This allows unique identification of over 65,000 different dictionaries. In the preferred embodiment, a connection address is 2 bytes, and a two-byte word of value binary zero is not a possible connection address.

In this manner, a compressor may instruct a decompressor as to which dictionary to use for decompression, where such dictionary may change in real time during decompression.

This process may operate in real time, and may operate continuously, typically with a number of memory-resident dictionaries; or a sampling approach may be adopted where a compressor samples at various times the compression ability of different dictionaries and when a trend is identified in the input symbol stream, issues the Change Dictionary command and swaps to the most efficient dictionary.

This requires that a same dictionary exists at the receiving end of a transmission. However, if such a dictionary does not exist there this does not mean that decompression must fail. The absence of a dictionary at the receiving end of a transmission of an ID identified in the compressor's CD command may trigger a request by the receiving codec system to the transmitting codec system to send the missing dictionary and once receive would then be resident for subsequent decompression.

In the embodiments of the present invention so far constructed by the present inventor, a connection address is two bytes (one word) long which means that a maximum of 65,536 connections may be uniquely identified and therefore a maximum of 65,536 connections may exist in a dictionary (excluding special cases). A connection is eight fields long of two bytes each, making a connection length of 16 bytes in total. This means that in respect to these said embodiments, a dictionary's maximum size is 1 MB. The word values binary zero and FFh are special word values in the said embodiments and they are not possible connection addresses. To allow ease of calculation, a dictionary is limited to a total size of 1 MB including header. As a header is 48 bytes in length and as the first connection is connection number one, the word values 00h, FFh, FEh, and FDh cannot be connection addresses and are therefore available for special use. In this embodiment described immediately above, there maybe up to 65,533 connections of addresses 1 to 65,533.

As connections are added and a dictionary approaches its maximum size, control variables change and slow down and at the limit stop the addition on new connections.

Common Dictionary Parts

Two instances of the present invention may each have a dictionary which is in part the same (each has "common dictionary parts"). Dictionary parts are common dictionary parts when a connection of a given address in one instance, when decompressed, yields the same symbol group as the connection of the same address in the other instance. For practical purposes, the minimum common dictionary part is the set of interface connections. That is, the interface connections in one instance must have the same connection addresses and must decompress to (must represent, or must be mapped to) the same symbols.

Common parts may consist in many more connections than interface connections. Identifying common dictionary parts is important when two dictionaries which have adapted differently by addition or where one has not adapted and the other has adapted by addition. In such cases, correct decompression is always possible by a compressor transmitting code words only from the common part. As long as all interface connections are common, one instance can always send a compressed stream which the other instance can understand (or if a receiving instance does not understand a code word, it can iteratively ask the transmitting instance to go down a level in the respective interconnection structure until code words are received which the receiving instance can understand). Communication between instances is described in more detail later.

Dictionaries—Adaptive & Non-adaptive

An adaptive dictionary is a dictionary which is subject to adaption by addition (adaption by change has special implications and is not what is meant by "adaptive dictionary". The term "adaptive dictionary" refers only to adaption by addition). A given dictionary may be used adaptively or non-adaptively. When used non-adaptively, the compression and decompression processes operate and some housekeeping functions may be performed, but new connections are not added.

Adaption by Addition When (and to What Extent)

Dictionaries adapt by addition to repeated code word groups in one or more compressed streams. A dictionary may adapt during compression as code word groups or generated by the compressor, or to one or more stored compressed streams after compression has finished. A dictionary may adapt by addition during or after compression, or during or after decompression. In the case of adaption by addition during decompression, repeated symbol groups within the compressed stream which are not represented in a dictionary may be added (as new connections) as such symbol groups in the compressed stream may be replaced in the compressed stream by the addresses of the newly-formed connections.

Adaption by Addition from Compressed Streams

A codec system may compress an input symbol stream and transmit or store the resulting compressed stream, or it may decompress a compressed stream created earlier by itself or received from another such codec system. The adaption by addition process may operate on such compressed stream, as it is transmitted, while it is stored, or as it is received, identifying repeated code word groups within it and creating new connections accordingly. The same applies to a larger stream consisting of a plurality of compressed streams. Alternatively, a codec system may identify such repeated code word groups as it compresses an input stream (for example by employing a lookup table or hash table of code words and code word frequencies or as described below in relation to use of the c-block) and accordingly create new connections in the dictionary during compression.

Degree of Adaption by Addition

The degree to which a dictionary adapts by addition to a given compressed stream (the resulting quantity of connections added) may vary according to whether adaption takes place in real time or batch mode.

Inputs to the Adaption by Addition Process

The adaption by addition process may operate on input symbols which are not represented in a dictionary (and may adding connections which represent them), or on code word groups in one or more compressed stream (by identifying repetitions and adding connections in respect of those repetitions). While the description of the adaption by addition process elsewhere herein may imply the processing of a single compressed stream after compression has completed, it is understood that the same process may be applied in real time during compression or decompression, or in batch mode, to all a compressed stream, part of a compressed stream, or to more than one compressed stream taken as a block.

Batch Adaption By Addition

During a batch adaption by addition session, the adaption process processes a batch of one or more compressed streams which existed in their entirety prior to the start of the current adaption by addition session. A batch may be, for example, all the compressed streams generated by the current instance of the present invention which have not previously been processed by the adaption by addition process. When repeated instances of a code word group are identified in such a batch of one or more compressed streams, and the various control values achieved, a new connection is added to the dictionary, and optionally the code word group in the compressed stream(s) is removed and replaced by the address of the newly-formed connection thereby further compressing the one or more compressed streams.

Real-Time Adaption By Addition

In real-time operation, a relatively smaller amount of time, compared to batch operation, is available for adaption by addition, because there is typically a smaller period of time between the time one input symbol (or code word in the case of adaption by addition during decompression) is processed and the time the next input symbol (code word) arrives for processing.

Whereas buffering an input symbol stream or compressed stream as the case may be may provide a more consistent amount of time during which real-time operation of the adaption by addition process may take place, an instance of the present invention may still have to limit the time spent on the adaption by addition process, compared to the time provided for in batch mode adaption, in order not to fall behind in the processing of received input symbols or received code words.

When an instance of the present invention uses a c-block, adaption by addition is achieved by analysing the frequency count in c-block connections and creating new d-block connection as further described below, and this analysis and addition may take place real-time during compression or decompression.

Adaption By Addition Via Supplementary Dictionary

Alternatively, before attempting to compress in batch mode an original symbol stream a compressor may parse the original stream in its entirety or one or more of its parts, one or more times, identify valid input symbol groups which are not represented in the dictionary, and either create a new supplementary dictionary to contain these identified input groups or add such identified input groups to the resident dictionary, or both. The connections in a supplementary dictionary may at a later time be added to a resident dictionary and thereby adapt by addition that resident dictionary to the data environment represented by that supplementary dictionary.

Dual-Block Adaption By Addition

A further variation in the manner of adaption by addition in the present invention consists in using two conceptually separate but not necessarily physically separate memory blocks and loading the dictionary into one such memory block (the "d-block") and using the other (the "c-block") to record typically during compression the frequency of repetition of input symbols or groups of input symbols in an input symbol stream.

When a pair of symbols or symbol groups are identified in an input stream and no connection is found in the dictionary, the compressor searches for a connection in the c-block which connects that pair. If not found in the c-block, the compressor adds such a connection to the c-block (a "c-connection") and adds that c-connection to the appropriate primary and optionally secondary c-block chain ("c-chain"). If found in the c-block, the compressor increments the frequency count of that c-connection, which in the present embodiment is a two-byte field starting at location 10 (which is therefore field 6) in a c-connection (locations are counted from 0, and fields from 1).

At that time or at a later time an adaption by addition algorithm of the present invention reads c-connections and adds connections to the d-block ("connections" or "d-connections") based on the count in field 6 of the c-connection, that is, where the frequency count in F6 exceeds the threshold number. In order that the compressor may efficiently access c-connections, field 6 of d-connections is reserved for the address (which may be an offset address relative to the start of the block) in the c-block of the c-chain associated with the d-connection. The first and second fields in such c-connections contain the addresses of the d-connections between which the respective c-connection subsists.

In this case a d-connection may be associated with two primary chains—one in the d-block and one in the c-block. Arbitrarily, field 6 of a d-connection is used in the preferred embodiment to record the address of an associated primary c-chain, if any. Similarly, field 3 of the d-connection is used to record the address of an associated primary d-chain, if any, and this is explained further below.

The matter of an associated chain is separate to the matter of a chain of which a connection itself is a member. A d-connection may be a member only of a d-chain (a secondary as well as primary d-chain. A c-connection may be a member only of a c-chain (typically only a primary c-chain but not excluding also a secondary c-chain).

Adaption By Change

The present invention optionally adapts a dictionary to a data environment by changing one or more of the connection addresses in an interconnection structure. The adaption by change process, also called "optimisation" is illustrated in FIG. 9, FIG. 10, FIG. 11, FIG. 22 and FIG. 23. As a result of optimisation, one connection in an interconnection structure may now not be used and may be removed, and another connection may be inserted into the structure. This process of adaption by change may re-occur at different times in respect of the same interconnection structure, and over a period of time one or more connections in a structure may become unused within that structure and one or more new connections may be added to that structure.

In the case where a connection is no longer present in any interconnection structure, that particular connection structure may be used by a different connection, that is, its connection field values may be overwritten by the values of another, typically a new, connection, and in this case the former connection is said to be "deleted". A connection may not be deleted until it is not part of any interconnection structure.

If such deletion occurs then compressed streams which contain the now-deleted connection address may not correctly decompress, therefore this form of adaption does not guarantee correct future decompression of backed up or archived compressed streams. Such deletion may also render a dictionary unequal to a dictionary or part thereof with which it wishes to communicate, and may prevent proper communication between different instances of the present invention. A chain which contains a connection which is to be deleted must, when that connection is deleted, be closed up so that the connection before that one in the chain points to the connection after that one in the chain in the case of ll chains, and in the case of bst chains, the now-to-be deleted connection must be properly removed from the tree.

To facilitate such re-use of connections, the present invention when allowing such adaption by change, maintains a free connection list ("FCL") of the addresses of now unused connections, and new connections take their addresses from the FCL until there are no connection addresses left in the FCL. And the FCL may be a chain and such a chain is called the free connection chain ("FCC"). The address of the FCC may be recorded in the dictionary header or the FCC may start at an invariant position in the dictionary known to codec processes; for example, at the first connection address after the end of the last interface connection. In the preferred embodiment of the present invention, free connections are identified as such by the presence of the value FFh in their first field. The value FFh is not a valid connection address. This allows rebuilding of the FCC in the event of a break in the links of the chain or branches of the tree.

Adaption By Change—Example

Taking text as a convenient form of data for the purpose of exposition, the adaption process which entails change of interconnection structures may be illustrated by the following example. The symbol group "determining" (the quotation marks are not part of the symbol group) is represented in a dictionary by an apex connection at address 123456. Beneath this apex connection in the respective interconnection structure are two further connections at addresses 7890 and 9012, which represent the symbol sub-groups "determini" and "ng" respectively. The sub-group "determini" is made up of the two further sub-groups (on the next level down in the interconnection structure) of "determin" and "i".

In this example, "determin" and "i" are connected together by the connection at address 7890, and "n" and "g" are connected together by the connection at address 9012, and these two connections are themselves connected together by the connection at address 123456 which creates an interconnection structure which when decompressed yields the symbol group "determining".

This is not an ideal structure, and the structure is improved where the connections immediately below the apex connection are "determin" and "ing". This is because "ing" is a more frequently occurring symbol group in the respective data environment (in this example, English text).

This repetition is not the same sort of repetition as applies to the application of the threshold number described earlier herein in relation to adaption by addition. The repetition which applies to the previously-described threshold number is repetition of different instances of the qualitatively same symbol group pair within one or more symbol streams or compressed streams. The type of repetition upon which adaption by change is based is repetition of the qualitatively same symbol sub-group within qualitatively different symbol groups within a dictionary (or dictionaries). That is, within qualitatively different symbol groups resulting from decompressing different apex connections, typically all the different apex connections, in a dictionary (or dictionaries).

In respect of this second type of repetition which relates to adaption by change, a second type of threshold number pertains, which is the number of times the apex connection of a given symbol sub-group occurs in a decompressed dictionary. And adaption by change is applied to said apex connections of sub-groups.

For adaption by change, the number of time the symbol group "determining" is encountered in a dictionary is not important. What is important is how many times the sub-group "ing" occurs in all symbol groups represented in the dictionary which contain the sub-group "ing". This criterion goes for all the subgroups within "determining", and further, for all sub-groups within a dictionary except.

Figure 22:
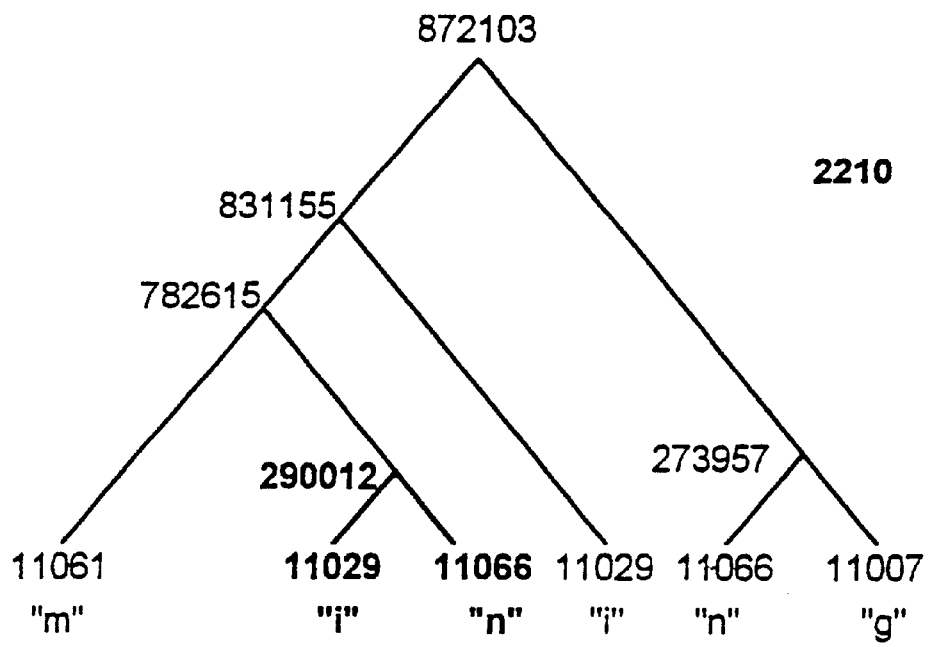
FIG. 22 illustrates two possible interconnection structures which on decompression yield the symbol group "mining".
Figure 22:
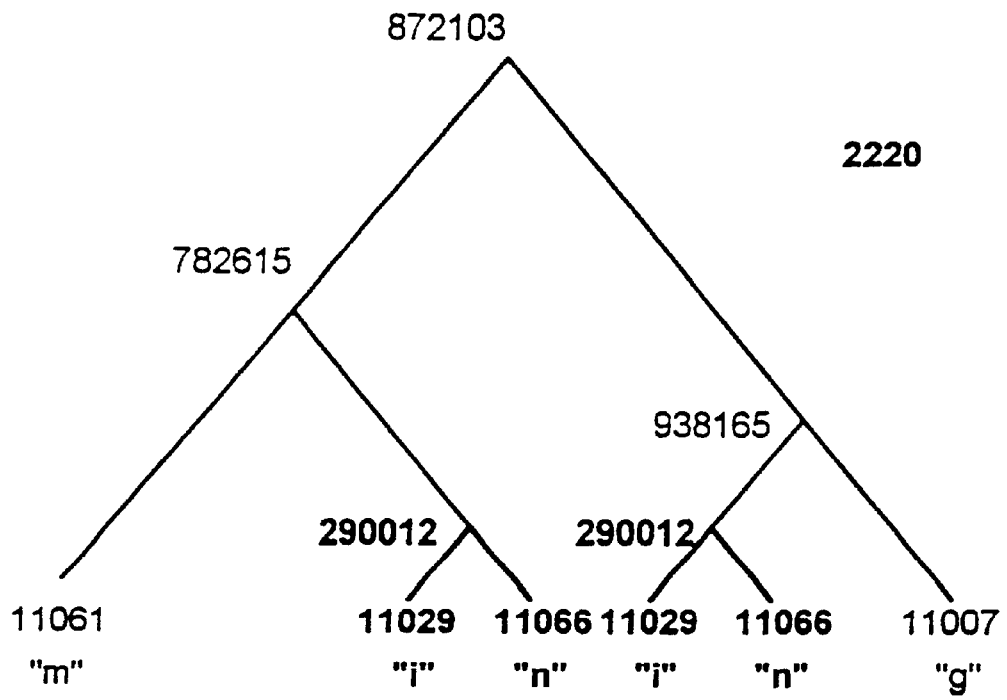

The object of adaption by change is to rearrange interconnection structures such that the most frequently repeated sub-groups, in the second sense of "repetition" described above, have apex connections of the sub-group (in the example of "determini" and "ng", the sub-group "ing" does not have an apex connection). Structural change consequent to adaption by change is illustrated in FIG. 22.

Referring now to the drawings and more particularly to FIG. 1 there is shown a flow diagram of the compression process.

When a symbol is received by the codec system for compression the symbol is processed 105. Because of the variable amount of time that mat be required for execution of the loop 110 the received symbols may optionally be buffered 108. If the incoming symbol stream is buffered, then the next symbol is got from the buffer 110. The codec system then executes a search operation 118. The search is executed against the interface connections in the dictionary using the value of the symbol as the search key.

The search operation seeks to achieve a match. For example, when the symbol "1" is received by the codec system for compression, the codec system searches for the connection which represents the symbol "1" among the stored interface connections.

When the match operation fails 118, that is, when the symbol is not represented by an interface connection in the dictionary, the codec system executes a write operation and writes a new interface connection to the dictionary which represents the symbol 120. When the match succeeds the codec system identifies the address of the interface connection which represents the symbol.

When the current symbol is the first this compression session 125, the pointer PP is set to the address of the first array location 128. The location to which pointer PP points is called "location PP". The address of the interface connection which represents the current input symbol is written to location PP 135.

The codec system then returns 115 and starts to process the input symbol 110.

Now referring to FIG. 2 which is a continuation of FIG. 1, the codec system executes a write operation and writes the address of the interface connection which represents the next input symbol to the next available location (PP+1) in the processing array 210.

There is now a pair of addresses in the processing array. The codec system now determines whether a connection in the dictionary exists between the two addresses in this pair 215. (FIG. 3 illustrates the process of seeking a connection in the dictionary.) If a connection exists then there is a connection where the first address in the connection is the same as the first address in the pair, and similarly, the second address in the same connection is the same as the second address in the same pair.

When a connection is found between the addresses in the pair, the codec system writes the address of the connection to location PP 218 then returns and gets the next input symbol 110. Pointer PP is not incremented. This has the effect of overwriting the previous address at location PP and the address at location PP+1 is ignored. It will be overwritten with the address of the interface connection which represents the next input symbol. (In the case where a stack, which is a variety of processing array, is used in place of the processing array described herein, addresses are popped from the stack rather than overwritten.) This is done because now that a connection is found, neither of the addresses in the pair need be stored or transmitted. Only the address of the connection need be used, because the address of the pair can always be found by decompressing the connection.

When a connection is not found between the addresses in the pair 215, and location PP is the first location relating to this input stream 220, pointer PP is incremented by one 225, and the next input symbol processed 110.

When a connection is not found and location PP is not the first location this compression session, the pointer PP is decremented by one 228. The codec system then evaluates the pair starting at the new location PP, and searches for a connection in the dictionary between the addresses in this pair 235.

When no connection is found, the codec system increments the pointer PP by one 240, therefor ensuring that the second address in the current pair is not now overwritten when the next input symbol is processed, then gets the next input symbol 110.

When a connection is found, the codec system writes the address of the connection to location PP 238. The effect of this is to overwrite the old address in location PP, and because pointer PP is decremented 228 before getting the next data unit 110, to discard the second address in the old pair. The reason for this is that now a connection has been found, there is no need to keep the pair, only the address of the connection which connects them. Discarding the second address in the old pair leaves a gap in the array, and this gap is closed by executing a copy operation and copying the value at address PP+2 into location PP+1 232, which is the location of the discarded address. In the case of using a stack, this effect is achieved by popping and pushing the appropriate values.

Referring now to the drawings and more particularly to FIG. 3 there is shown a flow diagram of the method within the compression process of finding a connection, referred to in conditional branches 215 and 235 of FIG. 2. For the sake of exposition, the two addresses between which a connection is sought are given the names A1 and A2, and it is understood that in respect of FIG. 2 conditionals 215 and 235 that they refer to the address in locations PP and PP+1 respectively.

The codec system executes a read operation and reads the first address (A1) in the pair. The codec system then shifts its attention to the item at the location of that address 305. This item may be either an interface connection or a connection which is not an interface connection 308.

When it is an interface connection, the codec system looks for an address of a chain 310 in the appropriate field among the fields which comprise that interface connection. If there is no address of a chain then the input symbol which the interface connection represents is not represented in the dictionary as connecting to anything 335 and the search process ends and returns failure. When an address of a chain does exist, then there is a chain in the next level up in the dictionary data structure, and the codec system sets a pointer, called the "search pointer" (SP) to that address 318.

Regarding address (A1), the codec system looks in the third field in the connection at that address for the address of a chain 315. When there is no address in the third field then the connection is not connected to anything 335 and the search process ends and returns failure.

When there is a chain's address in the connection's third field 315, the codec system sets pointed SP to that address 318. That is the address of the associated chain. That is, if there is a chain associated with address A1, search pointer SP is now set to the address of that chain.

The address of the chain is also the address of the first connection in the chain. The connection which pointer SP points at is called "connection SP". The codec system reads the second address in connection SP and executes a match operation against address A2 320.

When connection SP's second address does not match A2, that is, when connection SP does not connect A1 to A2, in the case where the chain consists of a linked list of connections, the codec system moves to each connection in the linked list, looking at the second address in each such connection 325, 328, 320. If the address A2 is found 320, the process ends returning success and the address of connection SP. If the end of the chain is reached and A2 was not found in any of its connections second place 325, then the process ends 335 returning failure.

In the case where a chain consists in a set of connections related as a binary search tree, the codec system searches the binary search tree, and the same applies to the results of a binary search tree search as applies to the results of a search of a linked list including a circular list.

Referring now to FIG. 4 there is shown a flow diagram of the adaption by addition process.

The codec system sets the adaption by addition pointer RP to the first address of the first compressed stream to be processed this adaption by addition session 405. It then starts execution of a loop operation 408 which reads each code word (address) in each compressed stream to be processed. Within a single adaption by addition session, the codec system may read each such address, or its replacement, in each such compressed stream, a number of times.

Within the loop starting at 408, the codec system looks at each contiguous pair of addresses in a compressed stream. These pairs of contiguous addresses are referred to by the shortened term "pairs". The term "adaption by addition" in relation to FIG. 4 is shortened to the term "adaption".

Typically, the second address of a pair would represent the information which was received by the codec system after receipt of the data which the first address represents. Another embodiment may formulate pairs in the reverse order, where the first address of the pair represents data received directly after those represented by the second. In this latter case other functions of the codec system would take account of this reverse order within pairs. However, whether one way round or the other, the addresses in a pair must represent data which were received by the codec system next to each other in time, that is, which were temporally contiguous.

For each contiguous ordered pair of addresses, the codec system during batch adaption counts the number of times the pair occurs within all streams to be processed this adaption session 410. In the case of adaption during compression, the codec system counts the number of times the pair occurs so far during the current compression session.

When no repetition is found, or when the frequency of repetition is less than or equal to a number called the "connection creation threshold" 415 the codec system increments the loop 418 and processes the next contiguous pair 408. The first address in the next pair is the second address in the current pair.

A pair consists of two addresses in a certain order. A Pair of the same addresses in the reverse order is a different pair, not a different instance of the same pair.

When the current pair is found to be repeated with a frequency greater than the connection creation threshold, a connection is created in the dictionary and/or optionally supplementary dictionary in respect of that pair 420. The connection creation process is illustrated in FIG. 5.

The number of times a pair must be repeated to trigger the creation of a connection is dependent on factors with respect to an embodiment of the present invention which include its particular use, its maturity, and the data type in question, and this number would be expected to vary between embodiments and possibly between or within an adaption session.

A connection between two given addresses of a given order, may be created once only. An embodiment may create connections after an invariant number of repetitions, or on some other basis, for example, on the basis of the top 20% of frequencies within the current adaption session, or, in order to moderate the growth of the dictionary or dictionaries, as a function of dictionary age and/or size.

After a connection is created in the dictionary 420 and FIG. 5 the address of the connection is written to the location of the first address in the pair 425 overwriting the original first address in the pair. The reason is that now a connection has been created between the two addresses in the pair, it is not necessary to keep both addresses. Only the address of the connection need be retained. The second address in the pair is now redundant, because this address is contained in the connection.

The location which contains the second address is now ignored 428, 430. As far as the adaption process is concerned it does not exist. Various means may be employed to achieve this end, for example, the rest of the sequence might be moved left one location to fill up the gap, or the location which holds the second address might be logically ignored, for example, where the first address in the pair is location PP, the location in the sequence now pointed to by RP+1 is the location that would previously have been pointed to by RP+2. In the case where a stack is used in place of the processing array described above, the same effect is achieved by popping and pushing the appropriate addresses at the appropriate times.

After the location of the second address is removed from the compressed stream, the codec system tests whether the session is ended 435 or the compressed stream is ended 438. When the compressed stream is ended the next compressed stream is found 440 and the processing of that compressed stream started 408. Alternatively, more than one compressed stream may be processed as a block and repetitions identified within the block as a whole.

Referring now to FIG. 5 there is shown a flow diagram of the method within the adaption process of creating a connection.

The codec system identifies the next location available in the dictionary for creation of a new connection 505, and sets a pointer, called the connection pointer (CP), to that location 508. The connection at that location is called "connection CP". The codec system then writes, starting at that location, the values which constitute the connection.

The first of the two addresses in the repeated pair is written to one of the fields in connection CP; and the second, to another. In the present embodiment, the first address in the pair is written to the first field in the connection 510, though in some other embodiment it may be written to some other field in the connection; and like-wise in the present embodiment, the second address in the pair is written to the second field in the connection 518. These addresses will, for the moment, be called the "first address" and the "second address" within a connection in virtue of being held respectively in the first and second fields.

Figure 6:
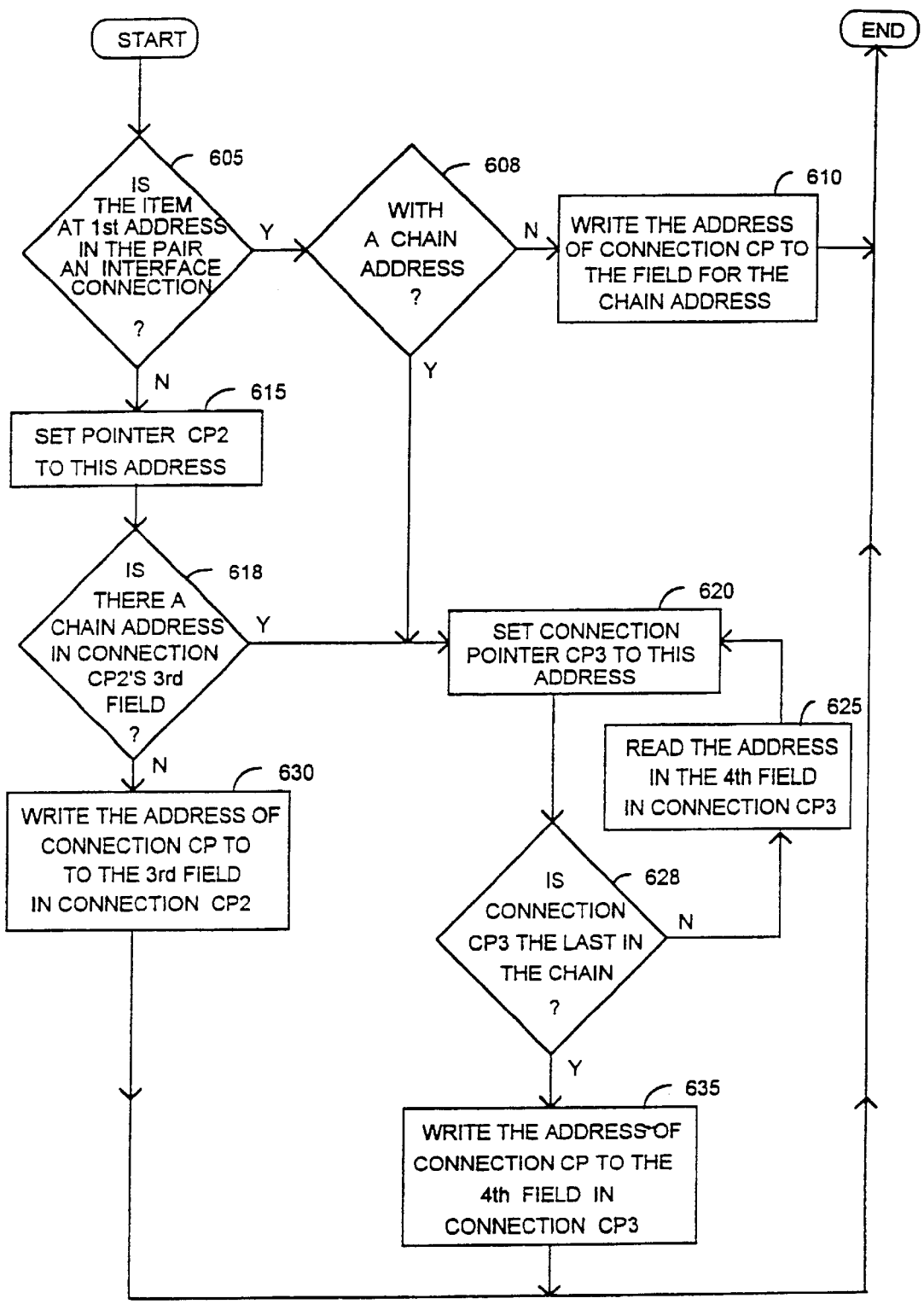
FIG. 6 is a flowchart illustrating the adaption by addition process.

The codec system then updates other existing items in the storage structure in the manner illustrated in FIG. 6 520. Then the connection creation process ends.

Referring now to FIG. 6 which is referred to in 520 of FIG. 5.

When the first address in the new connection CP is the address of an interface connection 605, the codec system determines if the interface connection has an associated chain on the next level up, that is, if it contains in its third field the address of a chain 608. When it doesn't, the coder system writes the address of connection CP to the field in the interface connection for the address of a chain (the third field) 610 then ends the connection creation process.

When there is a chain associated with the interface connection, that is, when there is a chain address in the interface connection's third field, then the connection pointer CP2 is set to the location of this address 615. The existence of an associated chain means a chain exists in respect of the input symbol which the interface connection represents, on the next level up from the interface connection.

When the item at the location of connection CP's first address is itself a connection 605-N, the codec system sets the connection pointer CP2 to the address of this connection 615 then looks at the field in connection CP2 reserved for the address of the associated chain, if any 618. In the preferred embodiment this field is the third field in a connection, and an address there is called the "third address" in virtue of being in the third field.

When the third field in connection CP2 does not contain the address of a chain 618-N, the codec system executes a write operation and writes the address of connection CP to the third field in connection CP2 630 then writes the value zero to the fourth field, which identifies this connection as the last in the chain.

The above case is a case of a chain which consists in connections related as a linked list. In the case where a chain consists in a set of connections related as a binary search tree, a connection which is a leaf node in such a tree is identified as a leaf node by the absence of addresses in the fields in that connection used for storing the addresses of branches of that tree structure, if any, and any new connection added in such a chain is inserted in the appropriate place in the tree according to a standard binary search tree insertion method. A chain consisting in connections related as a linked list including a circular list is called a "linked list chain", and a chain consisting in connections related as a binary search tree is called a "binary tree chain".

To reiterate, a chain is a group of one or more connections all of which connect the same connection to some other different, further connection. In the principal embodiment herein such chains all have this common address in their first field, and the address of the connection which the first connection connects to is in the second field.

The address of the first connection in a linked list chain is said to be the address of the chain. The address of the top connection, or root node, in a binary tree chain is said to be the address of the chain. The chain "associated with" a current connection is the chain whose connections have as their first address the address of the current connection.

In the embodiment described herein, each connection in the same linked list chain, except the last, holds the address of the next connection in the chain. Other embodiments may store this information in some other form and/or place. The analogous case goes for binary tree chains.

In the present embodiment, the fourth field in a connection is reserved for the address, if any, of the next connection in a linked list chain. An address in this field is called the "fourth address" in virtue of it being in the fourth field. In the case of binary tree chain, the fourth and fifth fields of a current connection are for the addresses of the further connections which form the two branches of the binary tree which emanate from the current connection.

The last connection in a linked list chain may be identified in a number of ways. In the present embodiment, there is a binary zero in the fourth field of the last connection. Typically the order of the connections in a chain reflects the order in which the connections were created.

When the third field in connection CP2 does contain the address of a chain, and it is a linked list chain, the codec system seeks to find the end of that associated linked list chain then add the new connection to the end. When it is a binary tree chain, the new connection is inserted into the binary tree at the appropriate place. The codec system sets the third connection pointer CP3 to the connection at the start or top of the chain 620 as the case may be.

In the case of a linked list chain, the codec system then reads the value in the fourth field in connection CP3 628. This field is the place reserved for the address of the next connection in the linked list chain.

When the fourth field contains the value zero, connection CP3, the first connection in the chain, is also the last in the chain, that is, it is the only connection in the chain. The codec system then executes a write operation and writes the address of connection CP to the fourth field in connection CP3 635.

When the fourth field contains a valid connection address 625 the codec system sets the third connection pointer CP3 to that connection 620 which then becomes the new connection CP3. This connection is the next connection in the linked list chain.

This loop of reading the fourth address then going to the connection at that address continues until the value in the field reserved for the fourth address is binary zero, that is, until the end of the linked list chain is reached 628-Y.

When the end of the linked list chain is reached, the address of connection CP is written to the fourth field in connection CP3 635, making connection CP3 the next to last connection, and making the new connection the last connection. The value binary zero is written to the fourth field in connection CP. The connection creation process then ends.

Other mechanisms may be employed by a practioner skilled in the art to identify the end of a linked list chain, for example, by identifying the end member of a linked list chain of connections by setting a flag in a field of the connection reserved for codec system-specific information other than addresses, or by holding the connection addresses in an indexed lookup or hash table, rather than employing pointers to link one connection to the next.

Alternatively, a linked list chain may be considered as a loop ("circular chain") and the first connection flagged as the first connection. In this case the last connection in the chain may hold in its fourth field the address of the first connection in the chain and the codec system may recognise that it has returned to the start of the circular chain because it identified the flag, or alternatively, because it has arrived back at a connection it had originally started from.

In the case of a circular chain, a connection may have only three address fields (address fields are fields which are intended to contain addresses) but one additional field is required in one of the connections in such a chain to record the address of the connection on the next level down in the interconnection structure with which the chain is associated, those three fields having the purpose of the second, third and fourth fields in the 4-field connection structure described earlier herein, and the additional 4th field in one of the connections in the chain, having the purpose of the first field in the 4-place connection structure described earlier herein.

Shorter Chain Identifier in a Circular Chain

In any event, as there are typically fewer chains in a dictionary than connections, a chain may be identified by an identifier of shorter length than a connection address, and such chain identifiers may be indexed to a separate lookup or hash table.

Decompressing a Circular Chain

In decompression, in the case of a circular linked list chain as described herein, the decompression process travels around the chain to find the address of the connection on the next level down, which typically is located with the first original connection in that circular chain.

Decompressing a Binary Search Tree Chain

In the case of a binary search tree chain, the decompressor searches the binary search tree for the address of the next connection down (the connection with which the chain is associated) and this address is typically located with the top or root node of the tree.

These variations are valid instantiations of the design, method and apparatus of the present invention.

Multiple Parsing of Compressed Streams

When a new connection is created in a dictionary during adaption as a result of the identified repetition of a pair of code words in the respective compressed stream, instances of the said identified repeated pair in the compressed stream may be replaced with the address of the new connection, and the adaption process may be executed again in respect of the now further compressed stream or streams. In this manner, repeated groups of code words in compressed streams which consist of three or more code words (addresses), may be established as structures of connections in the dictionary. A control variable may be manipulated to limit the maximum size of such a group of code words, or to limit or set the number of parses over the further compressed streams.

Decompression

Figure 7:
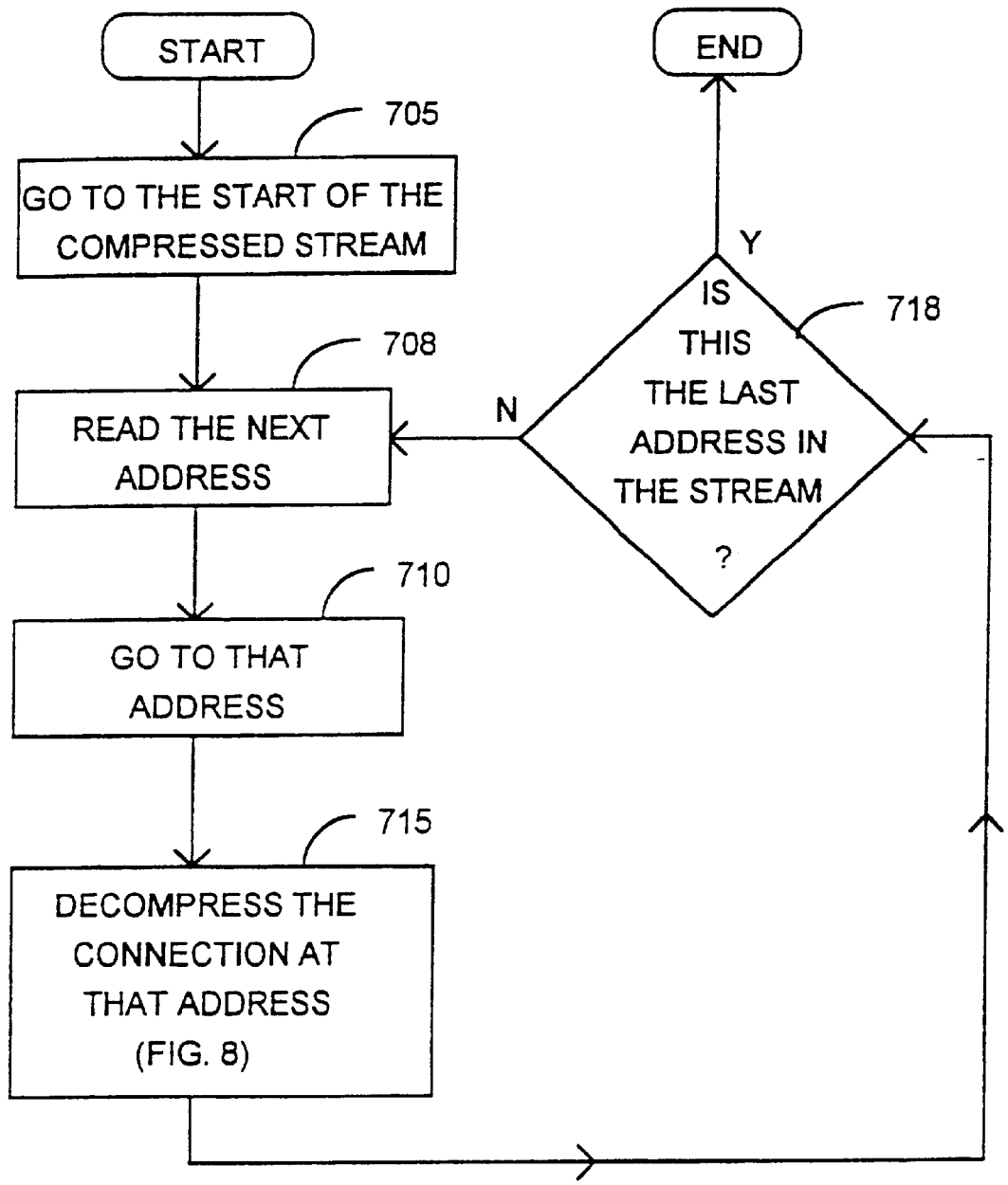
FIG. 7 and FIG. 8 are flowcharts illustrating the decompression process.

Referring now to FIG. 7 there is shown a flow diagram of the decompression process.

Real-Time or Batch Decompression

A decompressor decompresses compressed streams. Compressed streams may be received by a decompressor in real time over a communications system from another instance of the present invention or from another part of the current system, or may reside in the current system as stored data and decompression in this case is said to be in batch mode.

Interconnection Structure From Code Word

The decompression process operates on each code word. Each such code word is the address in the dictionary or dictionaries, including supplementary dictionary or dictionaries if any, of a connection; and such connections, other than interface connections, form the apex of an interconnection structure.

Decompressing a Structure

Starting at that connection whose address is the compression code word, the decompressor travels down and across the respective interconnection structure, transmitting the input symbols represented by the respective interface connections as interface connections are encountered, and in so doing, reconstructs the original stream of symbols.

Decompressed Stream Sent Where?

In decompression, the codec system may transmit the symbols resulting from decompression or write them to a reserved area of memory called the output symbol string. In some embodiments, an output symbol string may not be implemented, output symbols being passed directly to another process which is not a process of the present invention.

Figure 8:
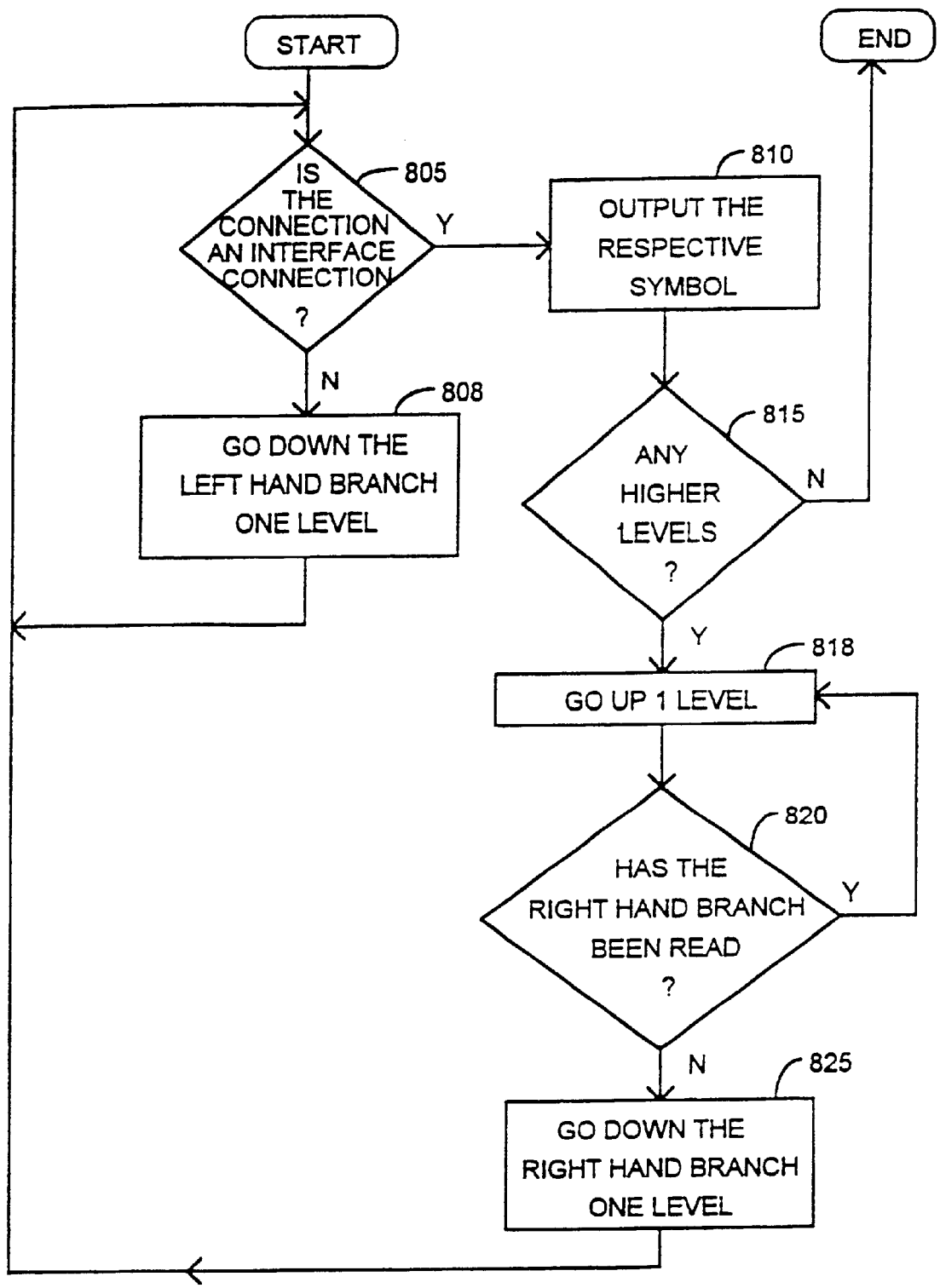

The decompression process processes each address in each compressed stream 705. The decompressor reads an address (code word) in the stream 708, and goes to that address 710 and decompresses the connection at that address 715. FIG. 8 illustrates the process of decompressing a connection. The codec system then tests for the end of the compressed stream 718 and when true 718-Y exists the decompression process.

Referring now to FIG. 8 which is referred to in FIG. 7 item 715.

The decompressor determines the type of the item at the current address 805. The type may be either an interface connection or connection which is not an interface connection.

When it is an interface connection 805-Y, the decompressor writes the symbol represented by that interface connection to the next available position in the output symbol string 810.

When the address is the address of a connection which is not an interface connection 805-N, the codec system executes a loop 808 and reads down the left branches of the inverted tree interconnection structure (of which FIG. 16 is an example) which branches out below that address through various connections on lower levels, to determine the symbols represented on its lowest level.

When a symbol is found and written to the output symbol string, or transmitted as the case may be, the codec system executes a conditional branch 815. When there are no higher levels (such as L0–L4 in FIG. 12) the decompression process ends.

When a higher level exists, the codec system goes up on level 818. The codec system examines the connection on this higher level to determine whether the right hand branch has been read previously 820. When it hasn't, the decompressor goes down the right hand branch and executes a loop starting in 805.

When the right hand branch has been previously read, the codec system checks to see if there is a higher level 822, and if there is, goes up to that level, then executes the loop starting in 820. When there is not a higher level, then the decompression process ends.

The result of this process is that new instances of the original symbols are written to the output string or transmitted as the case may be in the order in which they were originally received, thereby re-creating the original input symbol stream.

Figure 9:
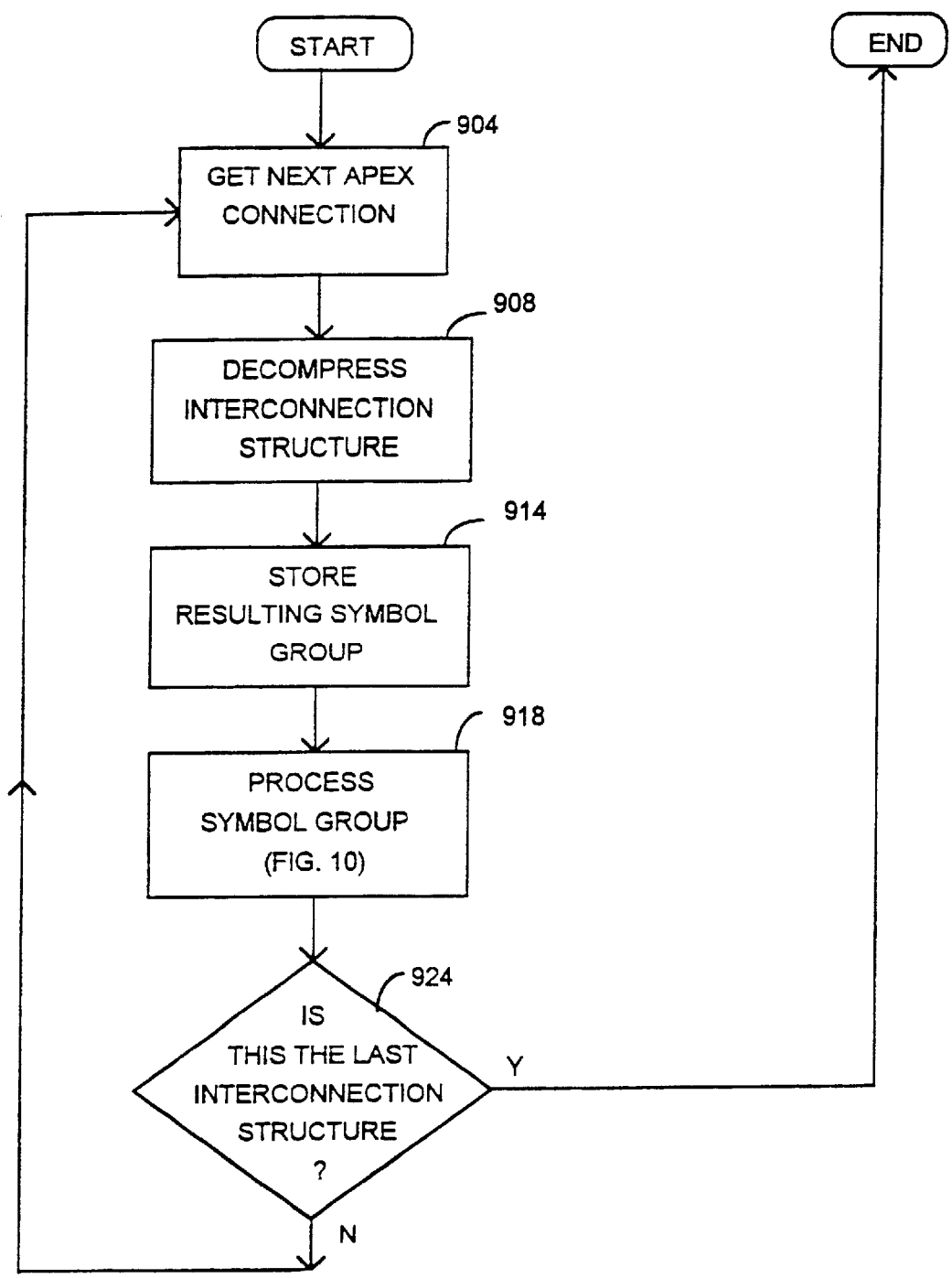
FIG. 9, FIG. 10 and FIG. 11 are a flow charts illustrating the process of adaption by change.
Figure 10:
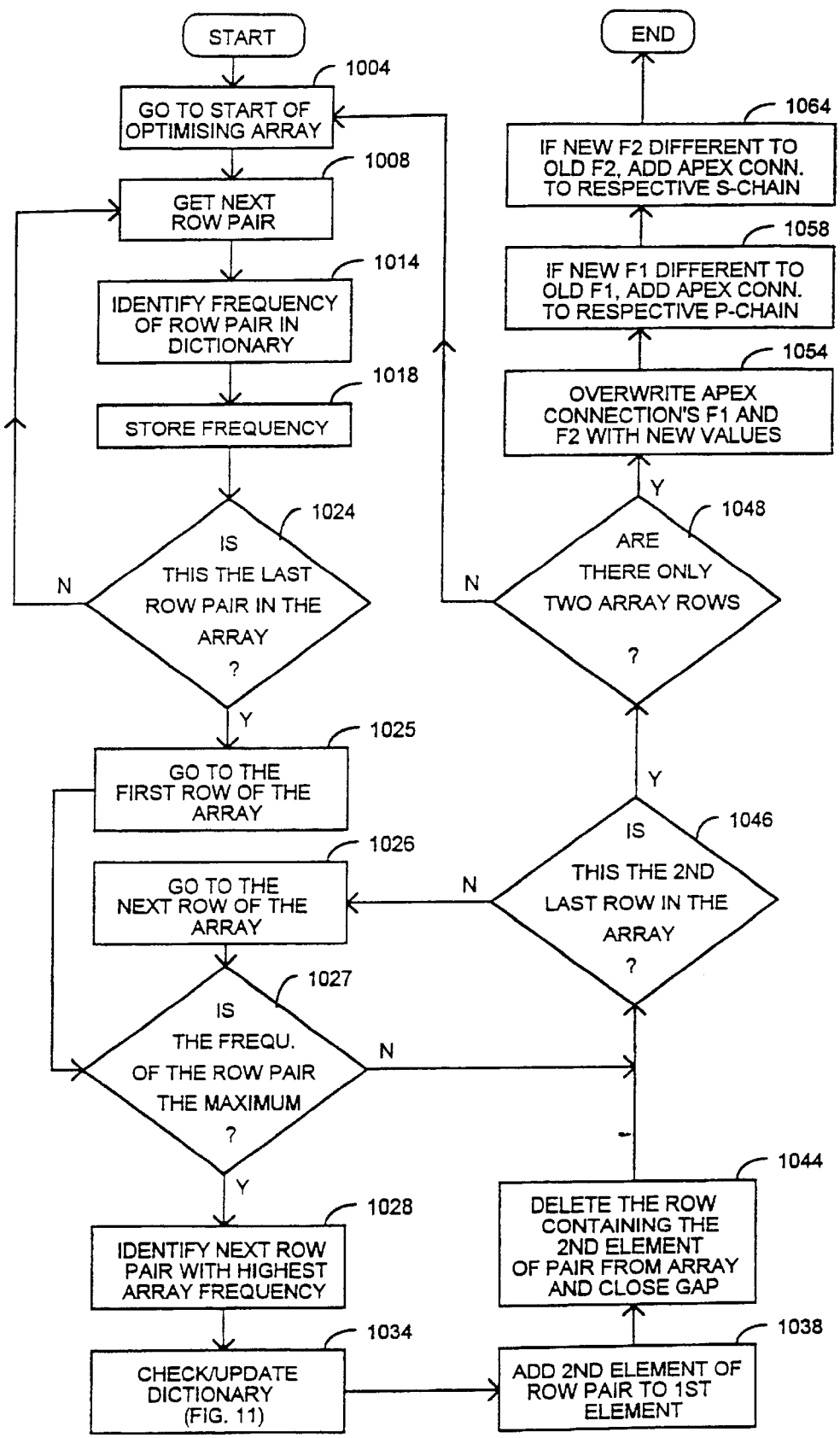
Figure 11:
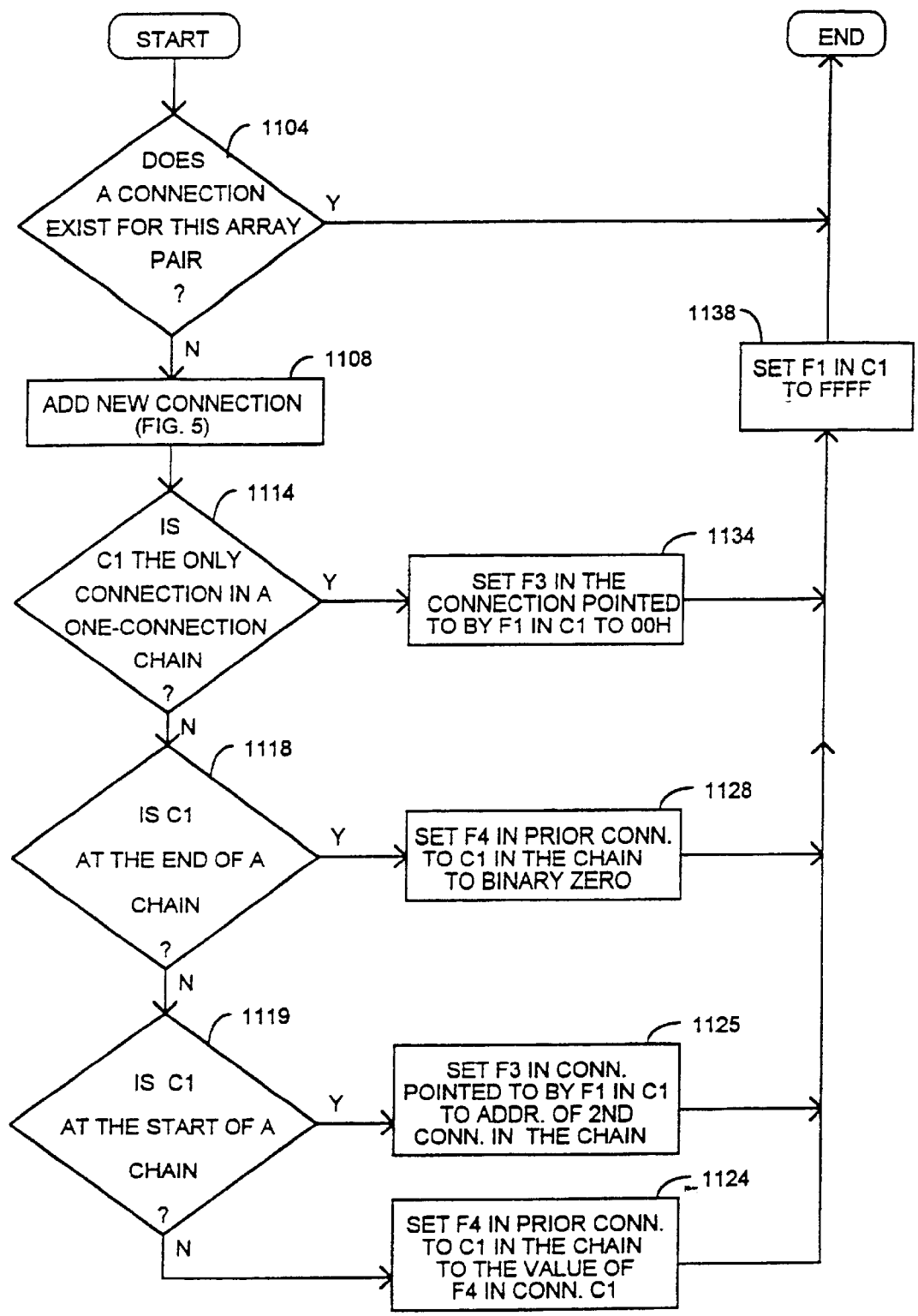
Figures 18, 19:
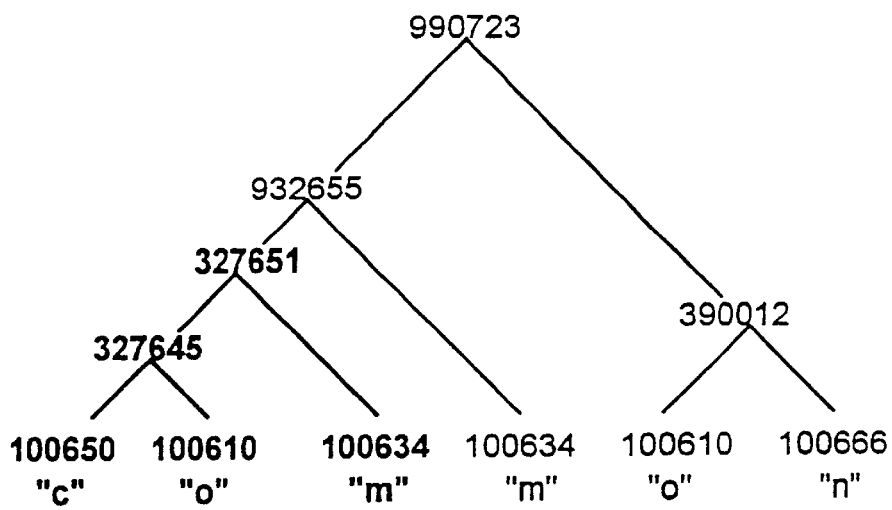
FIG. 18 illustrates an input symbol group, corresponding compression code word, and the corresponding symbol group of decompressed data.
FIG. 19 illustrates an interconnection structure part of which contains the same sub-structure as the connection illustrated in FIG. 16.

Referring now to FIG. 9 there is shown a flow diagram of a generalised adaption by change process which is further specified in FIG. 10 918 and FIG. 11. The adaption by change process shall be referred to here with the term "optimisation" and "optimiser". The optimiser gets the next apex connection from a dictionary 904 then decompresses it into its respective symbol group. An apex connection is illustrated in FIG. 19 where it is represented by the number 990723, and its respective symbol group is "common".

The symbol group resulting from decompression is stored 914 then processed 918 which processing is further detailed in FIG. 10. In the case where the current apex connection is that last apex connection in the dictionary, the optimisation process ends 924-Y. Otherwise 924-N, the optimiser gets the next apex connection 904, and repeats the loop 904–924.

Referring now to FIG. 10 which is an expansion of FIG. 9, 918 there is shown a flow diagram of the processing of a symbol group.

The symbol group is stored in an array called the "optimising array". The optimising array consists of rows an columns. When the array is first populated (FIG. 9, 914) each successive symbol of decompression proceeds is written to a next lower row in the array down the same column. This is further illustrated in FIG. 20.

The optimiser goes to the start of the optimising array, that is, to the first row in the optimising array 1004. The optimiser gets the contents of the next row in the array 1008 and adds it at the end of the first row. In the first iteration of the optimiser, the row pair consists of the symbols in the first row plus the symbols in the second row. For example, where the rows are initially "c" "o" "m" "m" "o" "n" going down the first column in the array, the first row pair is "co".

The optimiser then counts the frequency of occurrence in the dictionary of the row pair 1014. For example, in the case of the row pair "co", it decompresses each apex connection in the dictionary and if "co" is a sub-string of the symbol group resulting from that decompression, the optimiser increments and stores 1018 the count which records the frequency of occurrence of the row pair "co".

In the case where the current row pair is not the last row pair in the array 1024-N, the optimiser gets the next row pair and repeats the loop 1008–1024. The next row pair consists of the symbol in the second row of the current row pair plus the symbols in the next row in the array. In the example referred to above, the next row pair is "om".

Where the current row pair is the last row pair in the array 1024-Y, the optimiser then identifies the highest frequency count among the counts resulting from the last parse of the rows 1028, and if there is more than one highest frequency count, each highest count is identified 1025 to 1046. In the example above, the parse exemplified is the first parse, and the row pairs are "co", "om", "mm", "mo", and "on". Were the counts to be 150, 120, 100, 120 and 350, then the optimiser identifies the row pair "on" as the pair with the greatest count.

Having now identified the greatest count, the optimiser updates the dictionary 1034. FIG. 11 further details the process of updating the dictionary. In the event that more than one row pair is identified with a greatest count, each row pair so identified is updated 1028.

The optimiser now adds the symbol(s) which constitute the second element of the row pair at the end of the row containing the symbols which constitute the first element of the row pair 1038. And in the example above, the row which contains the second occurrence of the symbol "o" now contains the symbols "on".

The row which contains the symbol(s) which constitute the second element of the row pair is now deleted and the gap thus made in the array is closed up 1044. In the example above, the array would then be (from the top row to the bottom here represented as left to right across the page) "c", "o", "m", "m", "on".

In this example, the array was previously 6 rows deep. Now it is 5 rows deep. If the number of rows in the array is three or more 1048-N, repeat the loop 1004–1048. In the case that the number of rows is two 1048-Y, the apex connection of the interconnection structure which is being optimised (in the example, 990723) is overwritten in the following way.

The first row in the array now contains the full symbol group which resulted from the initial depression (FIG. 9, 908) which is the symbols of the current row pair. The second row in the array contains the symbols which constitute the second element of the current row pair. There is a connection in the dictionary which represents the symbols of the first element of the row pair and a connection which represents the second element. The address of the first connection is written to the first field (F1) of the apex connection, and the address of the second connection is written to the second field (F2) of the apex connection 1054 (the apex connection may or may not have changed as a result of doing this).

In the case where there is now a different F1 in the apex connection, the optimiser adds the apex connection address to the respective different chain 1058. For example, if F1 of the apex connection formerly decompressed to the symbol group "co" and now decompresses to the symbol group "com" then the apex connection is added to the primary chain each connection in which has an F1 which decompresses to "com". And the apex connection is removed from the primary chain all connections in which have an F1 which decompresses to "co". The analogous case goes for F2 of the apex connection and secondary chains 1064.

Referring now to FIG. 11 which is an expansion of FIG. 10, 1034, there is shown a flow diagram of the processing of updating a dictionary as part of the process of adaption by change.

The optimiser determines whether there exists in the dictionary a connection which connects the symbols of the first row pair element to the symbols of the second row pair element; that is, whether there exists a connection such that the address in its F1 field decompresses to the symbols of the first row pair element, and its F2 field decompresses to the symbols of the second row pair element 1104.

In the case where such a connection does exist 1104-Y, the process ends. When such a connection does not exist 1104-N, the optimiser adds a respective connection to the dictionary. FIG. 5 illustrates the process of adding a connection to a dictionary including adding a connection to a chain. In the case secondary chains are used, the connection is added to the respective secondary chain as well as to the respective primary chain.

Further, the optimiser determines whether there nevertheless exists in the dictionary a connection (C1) which when decompressed yields the symbol group of the row pair (that is, the symbols of the first row pair element followed by the symbols of the second row pair element). Where such a connection exists, the optimiser removes it from the dictionary. This creates a free space the size of one connection which may be used subsequently for a new connection. The description which follows refers to linked list primary chains ("chains") and an analogous case goes for bst chains and secondary chains.

If the connection C1 is the only connection is a one-connection chain 1114, the optimiser goes to the lower-level connection whose value in its first field is the address of C1. The optimiser sets the lower-level connection's third field to the value binary zero 1134. This removes the relationship of association between the lower-level connection and the chain consisting of C1. It also in this case removes the chain.

Where the connection C1 is member of a chain which contains more than one connection 1114-N, the connection C1 is removed from the chain. The chain itself continues to exist.

If C1 is a the end of the chain 1118, the value in field four of the connection immediately before C1 in the chain is set to binary zero. This identifies the immediately prior connection as the end of the chain and thereby removes from the chain connection C1 1128.

If connection C1 is after the first and before the last connection in a chain, the value in the fourth field of the immediately preceding connection is set to the address of the connection which immediately follows C1 1124. This removes C1 from the chain.

Where C1 is at the start of a chain consisting of more than one connection 1120, the third field in the lower-level connection whose address is the value of the first field in the connections of the chain, is set to the address of the second connection in the chain. This removes C1 from the chain 1122.

This completes the removal of C1 from the chain. The analogous case goes for a secondary chain. The optimiser may, once C1 is removes from all chains, add the address of C1 to the free connection list (FCL) which may be itself a chain with the special purpose of containing free connections. And when connections are to be added to a dictionary, the codec system may first check the FCL and use free connections found there if any (removing them from the FCL once they are used); or alternatively free space may be recorded in a hash or lookup table of by other means. In the event that an FCL is used, its address would typically be invariant and known to codes processes, or be recorded in a known place, such as a dictionary header.

Referring now to FIG. 12 there is shown a specific illustrative embodiment of the contents of part of a dictionary. For example a character "a" 1201 is stored in a location of a certain address 1202 (namely address 100586) and associated with which is an "associated address" 1203 (namely 103765).

Referring now to FIG. 13 there is shown a specific illustrative embodiment of a linked list primary chain of connections which starts at address 219550 1302 and which are associated with the symbol "c". Where there is a first address 1301 in the first connection which is the address of the first item connected ("c"), a second address 1303 which is the address of the second item connected (respectively "a", "e", "o", . . . moving down the page), a third address 1304 which is the address of the associated linked list chain which is on the next level up in the interconnection structure (arbitrary in this example), a fourth address 1305 which is the address of the next connection in the chain on the same level, and a place for other information used by the codec system 1306.

Referring back to the symbol "c" at address 100650 in FIG. 12 and referring to the connection at address 327645 in FIG. 15 a particular connection establishing "co" can be seen.

Referring now to FIG. 13a there is shown a specific illustrative embodiment of a linked list secondary chain of connections which starts at address 219550 13a02 and which are associated with the symbol "c". Where there is a first address 13a01 (F1) in the first connection which is the address of the first item connected ("c"), a second address 13a03 (F2) which is the address of the second item connected (the values in the column 13a03 have no significance), a third address 13a04 (F3) which is the address of the associated linked list primary chain which is on the next level up in the interconnection structure (arbitrary in this example), a seventh address 13a05 (F7) which is the address of the next connection in the secondary chain on the same level. The intervening fourth, fifth and sixth fields in the connection are represented by the elipsis points between 13a04 and 13a05.

Referring now to FIG. 14 there is shown a specific illustrative embodiment of a chain consisting in a set of connections related as a binary search tree, which is an alternate structure compared to the linked list structure illustrated in FIG. 13. The top, or root node, of the bst chain is the connection at address 340989 1402 and the address in its fourth field is 249586 which is the address of the connection which is the left branch of the root node, and address 370968 is in the fifth field of the root node connection and this address is the address of the further connection which constitutes the right branch of the root node connection.

This method of recording the branches of the binary search tree is iterated throughout the tree structure. Where there is no branching from a node, a special value is placed in the respective fourth or fifth field of the node connection which is indicative of the absence of a branch. In FIG. 10a the value zero is used for this purpose as indicated in the bottom-most abstracted connection illustration 1407.

The three ellipsis points in the fourth and fifth fields of illustrated connections in FIG. 14 indicate that further branchings may exist below that connection (node).

Referring now to FIG. 15 there is shown a specific illustrative embodiment of the linked list chain associated with the address that yields "co". The second address in each case indicates the various connections between "co" and other representations of symbols (respectively "a", "o", "n" . . . moving down the page). The second address could also normally indicate another connection.

Referring now to FIG. 16 there is shown a specific illustrative embodiment of an interconnection structure which yields the word "company" using addresses from FIG. 12, FIG. 13, and FIG. 15. Each location where a branching occurs is a called a level L, and the bottom of the structure is called the bottom level L0. For example, the leftmost branches travel down indirectly through nodes, which are connections, and different and lower levels to the interface connection which represents the symbol "c". There are 5 levels between (and including) the interface connection representing "c" and the address 890123, illustrated by the levels L0–L4 on the left side of the figure. Whereas there are only two additional levels between the interface connection representing the symbol "y" and the address 890123, illustrated by the values L0–L2 on the right side of the figure.

890123 is the address of the top-level connection and the address of the interconnection structure. It is this single address which, in this example, is stored or transmitted when the input symbol group "company" is compressed by the codec system. The numbers below this address illustrate an interconnection structure which yields the output symbol group "company" and would typically be set up as a result of adaption following a number of decompression processes according to FIG. 1 to FIG. 6 or during the compression process.

In order to later reproduce from the structure what was originally compressed, the codec system from the single top-level address 890123 follows the lower level connections down and across the structure to yield the symbol group "company" in the manner illustrated in FIG. 7 and FIG. 8.

Interconnection structures of different levels and branchings might also, in a different embodiment or in the same embodiment at a different time, decompress to yield the symbol group "company". Alternatively, there might not be a single top-level address which yields the symbol group "company". The group "company" might, for example, be stored as two addresses which yield, through their two respective interconnection structures, the symbol groups "comp" and "any". Or the group "company" could, in a poorly managed or young system, be stored as the addresses of its interface connections: 100650, 100610, 100634, 100682, 100586, 100666 and 100647 or some crude abstraction of them, such as 327645, 100634, 100682, 321098 and 100647.

Referring now to FIG. 17 there is shown a specific illustrative embodiment of the contents of a processing array during compression of the input symbol group "company", given that the connections shown in FIG. 16 are already in existence. The addresses in the array locations relate to the addresses in FIG. 12, FIG. 13, FIG. 15 and FIG. 16. The process which operates in respect of this array is illustrated in FIG. 1, FIG. 2 and FIG. 3. Alternatively a stack, which is a type of processing array, and which may be the CPU stack, may be used to achieve the same results. In this case, values are pushed and popped from the stack.

The letter or interface connection "c" is first received and identified in relation to address 100650, which is written in location 1 of the processing array. The letter "o" is then received ant its address in the dictionary is written to location 2. A connection is then found to exist at address 327645 and replaces both, in location 1. The letters "m" and "p" are then received, and again existing connections are identified, resulting in the address 795228 being stored as a compression of "comp".

The letter "a" is then received, but no connection between 795228 and 100586 exists. The letter "n" is then received and a connection between 100586 and 100666 is identified, and stored as address 321098, representing "an". Similarly a connection between 321098 and 100674 is identified as 678901 on receiving the letter "y". Finally an existing connection between 795228 and 678901 ("comp" and "any") is identified and stored as 890123.

Referring now to FIG. 18 there is shown a specific illustrative comparison between what is received, what is stored as compression proceeds, and what is decompressed. This simply shows that improvement of 7:1 has been achieved in storing the word "company" at a single memory address.

Referring now to FIG. 19 there is shown a specific illustrative embodiment of an interconnection structure which points to the symbol group "common" which illustrates an efficiency which may be achieved in information structures of this design. Namely that the same connection sub-structure 327651 which exists in FIG. 16 in respect of the symbol group "company" also exists in FIG. 19 in respect of the symbol group "common". Here connection 327651 ("com") is connected to 100634 ("m") rather than 100682 ("p"). Connections 932655 and 795228 could form part of a chain.

Referring now to FIG. 20 there is shown a specific illustrative embodiment of a variation to the process of compressing and input symbol stream compared to the process illustrated in FIG. 17. In FIG. 20 an input symbol stream 2010, 2030, 2050 is received by the compressor. Blanks in the rows 2010, 2030 and 2050 have no significance, do not represent any content of the input stream and are present only to assist visual alignment of the columns under the input symbols.

The symbol "c" is received by the compressor and the compressor copies that symbol's interface connection address (100650) into the top field of the processing array 2015-T1. In this illustration, the processing array is a set of four fields, and they are visually represented in a single column ("processing column"). Such a processing column may in other embodiments have a different number of fields and there is no specific limit on this number.

This single column of four fields is represented 30 times, each successive of the 30 representations displays the contents of the processing column (the state of the processing column) at a subsequent point in time, labeled T1, T2 . . . T30. For example, the processing column state labeled T3 occurs after the processing column state labeled T2 and before the processing column state labeled T4.

The symbol "o" is then received by the compressor and the respective interface connection address (100610) copied into the second to top field in the processing column 2015-T2. The compressor now searches for a match in the dictionary between the connection address at the next higher address in the processing column (100650) and the address in the current field in the processing column (100610). When the current field in the processing column is the top field in the processing column no match is sought and the next input symbol is processed. If there are no more input symbols the compressor goes to the column flushing routine then ceases compressing. The column flushing routine is described in detail below.

In the event a match is found, the compressor moves the current field pointer up one field towards the top of the column, then writes the address of the found connection to the now-current column field. This overwrites the address which was previously in that field and which was the first address of the pair between which a match was just sought by the compressor in the dictionary. The data in the former current column field (now in the field one below the current column field) is cleared. The compressor now iteratively repeats the above step of seeking a match between the address in the current column field and one immediately above until a match is not found or until the current field is the top field.

This process continues through column states T4 to T13 2015-(T4–T10) and 2035-(T11–T13).

The symbol "s" is now received by the compressor (the fact that no space is received between what appear to be two separate words is of no significance, and in the case of normal text, a space would typically be received and processed and in the same manner as other symbols). The compressor writes the address of the respective interface connection (100594) to the second field of the processing column 2035-T14. A match is not found in the dictionary between the address in field one of the column and that in field two of the column.

The symbol "t" is now received by the compressor, and the process described above continues until time T17.

At the start time T17 the compressor seeks to add to the processing column the address of the interface connection (100909) representing the symbol "r" 2035-T17 (since T14, the compressor has not found a match in the dictionary between successively received symbols). The compressor now, at the start of time T17, finds that the processing column is full (that is, the current field is the bottom field) and there is no unused field in which to record the newly-found interface connection address representative of the symbol "r'.

The compressor now transmits the address in the topmost processing column field (890123) as a compression code word 2040-T17. If an embodiment of the invention is configured to record symbol group frequencies in the c-block, then a connection is now sought in the c-block between the topmost address in the column (890123) and address immediately below (100594), and when found the frequency count of that connection is incremented (which, in the preferred embodiment held in field 6 of the c-connection), and when not found a c-connection is added to the c-block, added to the respective c-chain, if any, and if it is the first c-connection in a c-chain, then the c-chain address (which may be an offset from the start of the c-block) is written to field 6 of the d-connection whose address is in the first field of the respective c-connection. FIG. 21 illustrates the process of updating a c-block.

After transmitting the address in the topmost field as a code word and optionally updating the c-block, the compressor shifts each address in the processing column up one field towards the top, thus popping the address just transmitted from the top of the column and freeing up the bottom field (which may now be cleared) to receive the next interface connection address.

This process described above continues until the end of the input symbol stream is reached 2035-T18. At this time, the last symbol has been processed, but the processing column still contains one or more connection addresses (and in the case exemplified, contains 4 such addresses). In order to complete compression of the input symbol stream these remaining addresses must be transmitted as compression code words from the top used field successively to the bottom used field, and this process is called "flushing the processing column" 2040-(T19-T20) and 2070 (T21-T22).

Referring now to FIG. 21 there is shown a specific illustrative embodiment of the process of recording in the c-block the frequency count of received pairs of symbols or symbol groups.

Memory is conceptually divided into two blocks 2110. The dictionary is loaded into the d-block. A compressor is operating and it receives the symbol "s" then writes the address of the respective interface connection (100594) to the current field in the processing column 2115. The reset of the processing column is not shown in this illustration. A connection is not found in the dictionary by the compressor between the address 100594 and the next higher address in the processing column.

The symbol "t" is now received by the compressor 2120, and a connection is not found in the dictionary between the respective interface connection address (100618) and the next higher address in the processing column (100594). In now considering the process of updating the c-block, the following steps occur.

(1) the compressor reads the value in the sixth field of the interface d-connection whose address is 100594 2125. The fields which are illustrated as blank 2125 may or may not contain values and are illustrated as blank only for reasons of visual clarity. The sixth field of d-connections is reserved in the preferred embodiment for the address within the c-block of an associated c-chain, if any.

(2) where a valid c-block address is found in d-F6 2125, which may be an offset address from the start of the c-block, the compressor goes to the c-chain at that c-block address 2130 and then searches that chain for a connection which connects the addresses in the d-block of 100594 and 100618. The method of searching chain is described in illustrated elsewhere herein.

(3) When such a c-connection is found 2140 the compressor increments the value in the frequency count field of that c-connection which in the present embodiment is F6 an increments that value from 22 to 23 2140, then returns and processes the next input symbol. The value of c-F6 is illustrated with the value after incrementing has occurred.

(4) When such a c-connection is not found, the compressor creates such a c-connection and adds it to the appropriate c-chain, if any. The process of creating a connection and adding it to a chain is described and illustrated elsewhere herein.

(5) Where such a newly-created c-connection is the first in a chain the compressor writes the address of said c-chain to d-F6 of the d-connection at the d-block address which is the value of c-F1. Such a c-chain is called that d-connection's associated c-chain.

Further to FIG. 21, the c-block now contains the frequencies of occurrence of pairs of input symbols or pairs of input symbol groups where such pairs are not represented as connections in the dictionary. The adaption algorithm may now or at a later time read some or all of the connections in the c-block and add corresponding connections to the dictionary (in the d-block) where the c-connection frequency of occurrence (c-F6) exceeds the aforesaid threshold. This method had the benefit of avoiding separate parsing of input streams or compressed streams. A further improvement may be achieved by creating c-interconnection structures with various levels in the c-block in an analogous manner to those created in the d-block as described and illustrated elsewhere herein.

Such a c-block as described above typically fills up relatively quickly because all pairs of unmatched d-block addresses are added to the c-block. This is because when a new pair is first found which is not represented in the dictionary, it is not known how frequent that pair will be (whether or not it shall occur later in the input stream(s) of greater than the threshold value), therefore every pair must be stored in the c-block and counted. The contents of a c-block are typically discarded after an adaption session. One method of determining when adaption should take place is to trigger adaption based on when the c-block becomes full or almost full.

After a c-block is used to adapt a dictionary and before the c-block is used again, all d-F6 values should be cleared.

Referring now to FIG. 22 there is shown a specific illustrative embodiment of two different versions of the same interconnection structure 2210, 2220 being the "same" in the sense that each have the same apex connection and each decompresses to the same symbol group, but each does not share the same relationship between its constituent connections, and each does not contain the same set of connections.

A connection is represented by a branching. The connection address is set on the left hand side adjacent to the respective branching. The numerical value of the connection addresses have no significance. Interface connections are shown along the bottom row of each inverted tree structure.

The first inverted tree diagram 2210 represents a particular interconnection structure before adaption by change is executed (which is executed in respect of the symbol sub-group "ing"). The second inverted tree diagram 2220 represents the same particular interconnection structure after the operation of the adaption by change process (which is executed in respect of the symbol sub-group "ing").

Comparing the second inverted tree 220 with the first inverted tree 2210 the following is noted:

(a) connection 831155 in the first tree 2210 has been removed (if it was not part of any other connection structure then it may have been deleted from the dictionary)

(b) connection 938165 in the second tree 2220 has been inserted (if it did not exist in the dictionary then it has been added to the dictionary)

(c) in the first tree 2210 the two connections immediately below the apex connection are 831155 and 273957 whereas in the second tree 2220 they are 782615 and 938165

(d) in the second tree 2220 connection 273957 has been removed (if it was not part of any other connection structure then it may have been deleted from the dictionary)

(e) in the second tree 2220 connection 290012 has been inserted (making the second instance of that connection in this interconnection structure)

(f) in the second tree 2220 the "i" and "n" of "ing" are now connected and the "n" and "g" are now not connected ("g" is now connected to "in").

These changes have been based on the frequency of occurrence of the sub-group "ing" and the sub-groups within the sub-group "ing", namely, "in" and "ng", within different interconnection structurers (a "different" interconnection structure is one which decompress to different symbol group). Now "ing" is more frequent in the sense used here than "determini" therefore "determin" is connected to "ing". Within "ing" the sub-group "in" has greater such frequency compared to the sub-group "ng" therefore "i" and "n" are connected to yield "in" and "g" is connected to "in".

Having applied this process of adaption by change to the interconnection structure whose apex is 872103 2210, the same may be done to the remainder of the interconnection structures in the dictionary which represent symbol groups containing the sub-group "ing". This may b achieved by decompressing each apex connection in the dictionary and applying the adaption process in respect of those whose symbol group contain "ing". The same end may be achieved by other means including using the secondary chain structures in the dictionary to identify interconnection structures which decompress to symbol groups which include the sub-group "ing". For example, the secondary d-chain of the connection 273957 2210 contains all the connections in the dictionary which connect to the connection which when decompressed yields "ng", and this means may be used to identify cases where a connection which demonstrates to a symbol group which ends in "i" is connected to connection 273957, that is, which contains "ing".

Furthermore, the same process may be applied in respect of sub-groups other than the sub-group "ing". One means of determining the such sub-groups in respect of which to apply the process of adaption by change (if all interconnection structures are not to be subject to the process, and this may not be feasible) is to use the frequency count in the c-block, if any, and to apply the process to either or both addresses in the connected pairs recorded in the connections in the c-block. Alternatively, a count may be kept in d-connections which record the number of times that respective symbol group has been encountered since the count field was last cleared (which might have been the last time adaption by change involved that connection), for example in field 10 of d-connections, and when such count is over a certain level the adaption by change process may be applied to all interconnection structures in respect of the symbol group to which that connection with a count over a certain level decompresses.

Referring now to FIG. 23 there is shown a specific embodiment of the process of adaption by change where an apex connection is decompressed to yield the symbol group "zapping" each symbol in which is then written to a successively lower row of the array 2300 in the same column 231 after which the frequency of each row pair is ascertained and written to a column of the array 237 which is not a column for use by a symbol. The number of rows and columns illustrated is not intended to signify a likely or appropriate number in respect of any particular embodiment of the present invention but is so illustrated simply for the purpose of exposition. The frequency count in column 207 refers to the row pair formed by the symbols on the same row, which constitute the first element of the pair, plus the symbols on the next row down, which constitute the second element of the pair. For example, in the first row, the count of three refers to the row pair "za".

Regarding the row pair of maximum count, the symbols comprising the second element of the pair are appended to the end of the symbols comprising the first element of the pair in the same row as the first element of the pair 2310-42. The row containing the symbols of the second element of the pair is then deleted from the array and the gap closed up. This can be seen by comparing array image 2300 with array image 2310. The process iterates 2320, 2330, 2340, 2350 until there is one row at the top of the array 2360 which consists of all the symbols of the initial decompression. The entry "n/a" means that a value in the respective field is not applicable.

Client-Server

Figure 24:
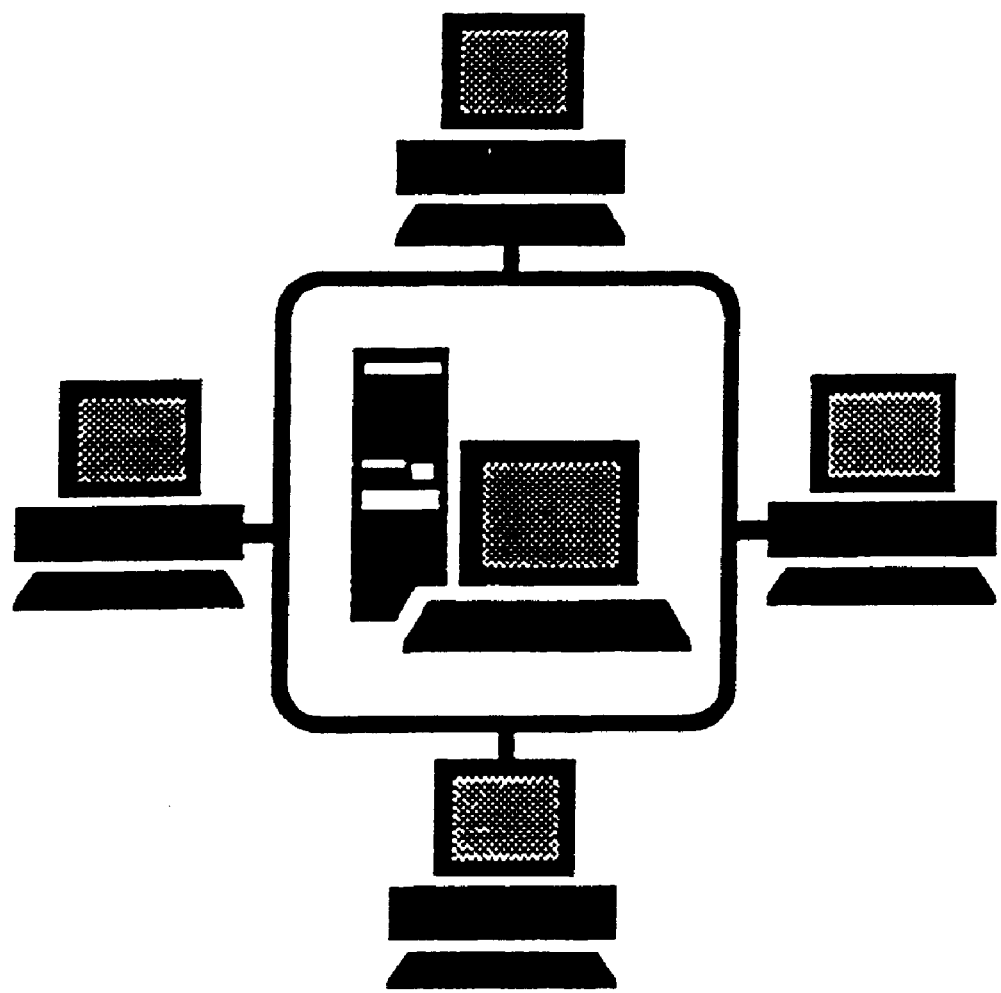
FIG. 24 illustrates a client-server configuration of computewrs.

Referring now to FIG. 24 which illustrates a client-server configuration of computers. In a client-server computer configuration where clients use non-adaptive dictionaries and their server's dictionary is adaptive and both dictionaries were a one time the same, and where the client transmits a compressed stream to the server, the code words in said compressed stream will be either apex connections or connections below an apex connection in the server dictionary and shall decompress correctly. Using FIG. 19 to illustrate this process, where a client dictionary contains apex connection 932655 ("comm") and 390012 ("on") and where its server's dictionary contains these same appex connections but where the server dictionary has adapted by addition and created new apex connection 990723 which is not present in the client's dictionary, the client compresses the symbol group "common" and it transmits to the server the code words 932655 and 390012; and when the server received these two code words it decompresses them to the symbol groups "comm" followed by "on". When said server transmits to the client it may transmit code word 990723 in which case the client will recognise that this code word is unknown and send a request back to the server to go down a level in the server's interconnection structure below 990723 and send the next lower connection addresses 932655 and 390012 and the client will correctly decompress these. Alternatively, the server may know that the apex connection 990723 is not in the clients dictionary (because the highest-numbered address in the client's dictionary is less than 990723) and go down a level than send 932655 and 390012 instead of 990723. This method may operate iteratively. This method will not be guaranteed of success where the process of adaption by change is used.

Updating Adaptions from Server to Client

A server may update its adaptions to a client by transmitting to the client connections created by the server since the previous adaptions were transmitted and incorporated into the client's dictionary. These are added at the same address in the client dictionary. The respective chains in the client dictionary are updated as illustrated in FIG. 4, FIG. 5 and FIG. 6 and as described elsewhere herein. In the case of FIG. 9, and where the process of adaption by change has not been used, this means connections after the last such one previously sent to the client, and up to the end of the server's dictionary.

Two Adaptive Dictionaries

For an instance of the present invention to correctly decompress the compressed stream of another instance of the present invention, where each instance uses an adaptive dictionary, each dictionary must at some time in the passt have been the same. This means that at least their symbol mappings need to have been the same. Such instances transmit a preamble to transmission proper to determine each others common dictionary parts, and then communicate using only these parts. Using FIG. 9 to illustrate this, where only their symbol maps are the same, then the compressed stream for the symbol group "common" will be 1000650, 100610, 100634, 100634, 100610 and 100666. Where the level of commonality is higher, fewer code words are required, for example, 327651, 100634 and 390012. This is a process of partial decompression which ensures a compressed stream is produced by a compressor which will be correctly decompressed by the receiving instance of the present invention.

Updating Between Two Adaptive Dictionaries

The method of adding connection address from server to client will not work in the case where both are adaptive, because an address in the transmitting dictionary which is not part of the common dictionary structure constitutes an adaption by addition of the sending system to its own particular data environment, and this same address value may have been already allocated in the dictionary of the receiving system to one of the receiving systems own (different) particular adaptions by addition.

One adaptive dictionary which is adaptive by addition may update another adaptive dictionary which is adaptive by addition thusly: the transmitting dictionary sends all (or some) of its interconnection structures to the receiving dictionary. The lower one or more levels in such structures will be part of each dictionary's common dictionary structure, and in respect of the parts which are not addresses in the common dictionary structure, the receiving dictionary may add new connections in its dictionary as it travels up through the levels of a transmitted interconnection structure. In this case the the symbol group to which the interconnection structures decompress will be the same in both dictionaries but the addresses above the level of the common dictionary parts may be different.

Real Time Update of Client Dictionary

Where partial decompression is used by a server when generating a compressed stream for a client, the server may transmit the update connections real-time with the compression code words, tagged to distinguish them from the code words.

Structures used by Other Processes

Other processes optionally operate in the present invention other than the for main processes of compression, decompression, adaption by addition and adaption by change (optimisation). They use the following further data structures and formats:

(1) a process which creates, transmits, receives and interprets a transmission preamble uses a preamble data format, which contains a preamble start and end marker and between them, data, and where variable-length data values are included in the preamble, field markers which delimit each such data values.

(2) a process which transfers information from one dictionary to another, called pre-adaption, does not require a data format as the process operates on a compressed stream, adapting to repeated code words or groups of code words in that stream which are addresses in the dictionary of the receiving system.

(3) a process which creates, transmits, receives and actions the transmission of a stream between two unequal dictionaries which includes tagged symbol groups and code words, or which is preceded by transmission of a supplementary dictionary uses a data structure which delimits and identifies symbol groups from code words, and in the case of a supplementary dictionary, delimits and identifies such a dictionary.

(4) a process which updates a client dictionary from a server dictionary uses a data format to transmit such an update and this format delimits and identifies the group of connections in which the update consists and optionally this process uses a further data format which delimits and identifies a return message from the client to the server which contains data relating to the verification of such additions or changes including a verification error code and/or a sample of decompression proceeds.

(5) a process where a client receives a code word from a server, determining that such code words is not present in the client's dictionary, returns the code word to the server, whereupon the server partially decompresses that returned code word and sends the partial decompression proceeds being two further code words back to the client, uses two data formats. The first consisting in a format which delimits and identifies said returned code word, and the second which delimits and identifies said returned decompression proceeds.

(6) a structure of a command embedded in a code word stream where such structure consists of a command prefix which is a bit pattern which identified that the following n bits are part of a command; followed by a command name which is bit pattern which identifies the respective command; followed by a command argument which is a bit pattern which constitutes one or more values which are part of the command and which when interpreted in conjunction with the command name lead to the execution of said command.

Instance-to-Instance Communication

When one instance of the present invention seeks to decompress a compressed stream created by another instance of the present invention:

(a) the dictionary of each instance may be the same. In this case, the compressed stream of either instance may correctly be decompressed by the other.

(b) the dictionary of each instance may have the same symbol mappings (interface connections), same interconnection structures, the same set of connections in each chain, but a different method of relating connections within a chain (for example, as a linked list or as a binary search tree). In this case, the compressed stream of either instance may correctly be decompressed by the other, providing the appropriate chain searching method is used.

(c) the dictionaries may be different and may never have been the same. In this case neither instance may quickly or easily correctly decompress the other's compressed stream.

(d) the dictionaries may be different now but may once have been the same. In the case, each may correctly decompress the other's compressed streams by using the parts of their dictionaries which were once and now are still the same. Dictionaries which were once the same will now at least contain the same interface connections. This is because adaption by addition and adaption by change do not alter interface connections. Each such dictionary must originally have contained a complete set of possible interface connections. In the case each did not originally contain a complete set of interface connections, a decompressor must know a rule for converting a compression code word which is an interface connection into the symbol to which it maps.

(e) where dictionaries were formerly the same, one dictionary may now be used adaptively (adaption by addition) and the other non-adaptively. This is called a "client server" configuration, and the client's non-adaptive dictionary is the same as a former state of the server's adaptive dictionary. In this case the server may always correctly decompress compressed streams transmitted by the client, provided the server adapts only by addition, but in order that a client decompress the server's compressed streams, the server must use only the part of its dictionary which is in common with the client, or transmit its adaption prior to code words.

(f) where dictionaries were formerly the same, each may now be used adaptively (by addition). In this case, different connections will have been added to what was formerly and now still is the same old dictionary nucleus. Each instance may correctly decompress the other's compressed streams when each uses only the common nucleus.

The sameness of dictionaries may consist in:

(a) the same interface connections. Every interface connections maps to the same symbol. In this case the part of the dictionaries which is the same is the dictionaries' lowest level. This is the minimum requirement for practical communication between instances. This assumes all possible symbols are mapped to interface connections.

(b) the same interface connections and some higher level connections which are the same. Connections at given addresses in higher levels decompress into the same symbol groups. In this case the parts of the dictionaries which are the same as larger parts than in (a) above, and consequently all else being equal, better compression and decompression speeds may be anticipated.

(c) the same interconnection structure but different addresses (that is, for every connection address in one dictionary there is a connection address in the other which when the connection at that address is decompressed yields the same symbol group; but the addresses, although equivalent in this sense, are not the same values). In this case, with the assistance of a translation (cross-reference) table which maps the 1:1 relationship addresses in one instance with the respective addresses in the other, relatively efficient communication between instances may be achieved using compressed streams.

(d) different chain access methods. Whether a chain is structured as a linked list or a binary search tree has no effect the sameness of dictionaries. If the chain access method is the only difference between dictionaries or parts of dictionaries, then the dictionaries (or their parts) for the purpose of compression and decompression, are the same. They will each correctly decompress a compressed stream.

Preamble Process

The preamble process is a process which creates, transmits, receives and analyses a preamble transmission. A preamble transmission is a transmission between two instances of the present invention, typically preceding transmission of one or more compressed streams, which transfers information designed to establish (a) whether any compressed stream created by either system may be decompressed by the other, and if so (b) the requirements which must be met in order to achieve this. Typically such requirements entail one or both systems using only part of their respective dictionaries (an instance of the present invention may have available for use more than one resident dictionary).

Preamble Format

In the preferred embodiment, a preamble to transmission proper consists of an identifier indicating that the preamble has started, and at the end of the preamble an identifier indicating that the preamble is ended. Between the starting and ending identifier, the transmitting system transmits the address of the connection most recently added to its dictionary. Typically, addresses of connections would form a simple ascending integer sequence. For example, if the most recent but one connection address were 123456, being a memory location offset where the addressable unit is a byte, and if connections were 10 bytes long, then the address of the most recently added connection would be 123466, and this address is transmitted between the preamble starting and ending identifier.

Other information may be transmitted within a preamble, for example, information related to possible difference in method or structure between the two dictionaries which information is required to ensure correct communication. Where multiple resident dictionaries are available for use by an instance of the present invention, the preamble may include a code which identifies which one is first required.

Original Dictionary ID

If two instances of the present invention began each with a copy of the same dictionary then a unique dictionary number of that original dictionary plus the highest-numbered address in that original dictionary will identify the common parts of the dictionaries each instance now uses. This assumes that only adaption by addition has occurred since each dictionary was fully the same. The unique dictionary number plus the highest connection address number is called the "original dictionary ID".

When dictionaries change by only adding connections, and assuming that added connections always have higher connection address numbers, then the youngest connection address of the original dictionary will be the highest address number in that original dictionary and this address will demarcate the original dictionary: all addresses of an equal or lower number will be within the original dictionary and all addresses of a higher number will have been added subsequently.

The original dictionary may be adapted by change, and after that adaption by change has ended, the dictionary may be transferred to other instances of the present invention and thereafter adaption may be only by addition in those separate instances, thereby enabling the various instances using the said dictionary to communicate easily with each other.

Client-Server Preamble

In the case where a server updates a client, a client-server preamble may be used, and a client notifies the server of the address of the client's most recent connection, and the server then sends some or all the server's connections created after that time (typically of a higher address number). This applies to adaption by addition.

Preamble Process in Detail

In the preamble process:
(a) each newly-communicating system first swaps a preamble.
(b) such preamble includes delimiters, optionally control fields, commands, and data.
(c) such data includes the address of the most-recently added connection (the "youngest connection") in the host system's dictionary (the host system is the system which is transmitting the preamble).
(d) and optionally includes an identifier which identifies the dictionary which was present when the system first started operating plus its youngest address at that time (original dictionary ID), which, plus subsequent adaptions by addition, is the dictionary which is now operating.
(e) the address of the transmitting system's youngest connection is extracted by the receiving system from the preamble of a transmitting system and stored in the receiving system. (The address of the youngest connection in a system's dictionary is retained in that system and updated as new connections are added to that system's dictionary, but this address is stored in a different location to the address of the youngest connection which is extracted from the preamble of a different instance of the present invention.)

Client-Server Batch Update Process

In the client batch update process:
(a) a preamble has already been swapped and interpreted.
(b) the only differences between the dictionaries of the client and of the server are additional connections in the server dictionary, and optionally a different structure of some or all chains (but not a different set of connections in a chain, and not different interconnection structures).
(b) the server transmits from its dictionary some or all connections plus their addresses which are younger than the client's youngest connection.
(c) once received by the client, or as they are being received, such younger connections are added to the client's dictionary at the transmitted addresses which are the same addresses at which those connections exist in the server's dictionary.
(d) the client stores a new youngest connection address, which is now the address of the youngest connection amongst the newly-added connections transmitted from the server.

Client-Server Code Word Exception Process

In the code word exception process:
(a) preambles between client and server have already been swapped and interpreted.
(b) the only differences between the dictionaries of the client and of the server are additional connections in the server dictionary, and optionally a different structure of some or all chains (but not a different set of connections in a chain, and not different interconnection structures.
(c) the client receives a code word from the server and determines that said code word is not present in the client's dictionary (is not an address of a connection: is numerically greater than the youngest connection in the client).
(d) the client notifies the server that the client has received from the server a code word which is not a connection address in the client's dictionary.
(e) the client makes such notification in a transmission called a "code word exception transmission" which has a data format which contains one delimiter of the transmission in the case of a fixed-length transmission and two delimiters of the transmission in the case of a variable length transmission, and after such first delimiter, contains the said code word or an identifier which identifies it.
(f) the server receives the code word exception transmission, identifies from its first delimiter that is such an exception transmission, and identifies the respective un-found code word.
(e) the server then decompresses that code word one level. If the code word in an interface address then an error condition is generated since that code word should be present as a connection address in the client's dictionary.
(f) such partial decompression generates two code words which are the addresses of the connections on the next level down in the respective interconnection structure in the server dictionary below the address of the connection which is the code word returned or identified as un-found by the client to the server.

(g) the server transmits the two lower-level code words back to the client.

(h) the transmission which contains the two lower-level code words is called a "code word decompression transmission" and consists in one or more delimiters which identifies the transmission as a code word decompression transmission, and the two respective code words are transmitted a data within such transmission. Or in the case where transmission of code words from the server is halted by the client decompressor on receipt an unrecognized code word, the two lower level replacement code words may be transmitted by the server without any enclosing data structure, and they will be interpreted and dealt with by the client decompressor in the same way as applies to any other received code words.

(j) in the case where an enclosing data structure is used, the client receives the code word decompression transmission and recognizes it as such from the initial leading contents of that transmission. The client then processes each of the two embedded code words as it would other code words.

Client-Server Real-Time Update Process

In client real-time dictionary update process:

(a) a client-server code word exception occurs as described above.

(b) in response to receiving a code word exception transmission from a client, the server transmits back to the client the two lower-level addresses (code words) in the server's respective interconnection structure (a code word decompression transmission). And also transmits the connection, which was not found in the client dictionary, which in the server's dictionary connects them.

(c) the transmission by the server of the two newly-found code words and their respective server dictionary connection plus its address in the server dictionary may all be included as separate appropriately delimited data values in the code word decompression transmission sent by the server to the client, or the connection and its address may be transmitted in a separate, appropriately delimited transmission before or after the code word decompression transmission.

(d) the client system receives and extracts the connection and that connection's address in the server dictionary, and adds the connection at the same address in its own dictionary (along with updating chain structures where necessary as described elsewhere herein).

Pre-Adaption Process

In the pre-adaption process:

(a) an instance of the present invention receives a compressed stream from another instance of the present invention.

(b) the two instances have the necessary common dictionary elements as are required for correct decompression of each others compressed streams; and each transmits to the other a compressed stream which may be thusly correctly decompressed.

(c) the received compressed stream contains repeated groups of one or more code words which are then addresses in the receiving instances dictionary.

(d) the receiving instance adapts to said redundancy in the received compressed stream by applying the adaption by addition process as described elsewhere herein to that stream, and as a result adds connections to its dictionary (and updates chain information as necessary).

(e) in so doing, the receiving instance adapts to the data environment of the transmitting instance.

Benefits of Addresses as Code Words

Figures 25, 26:
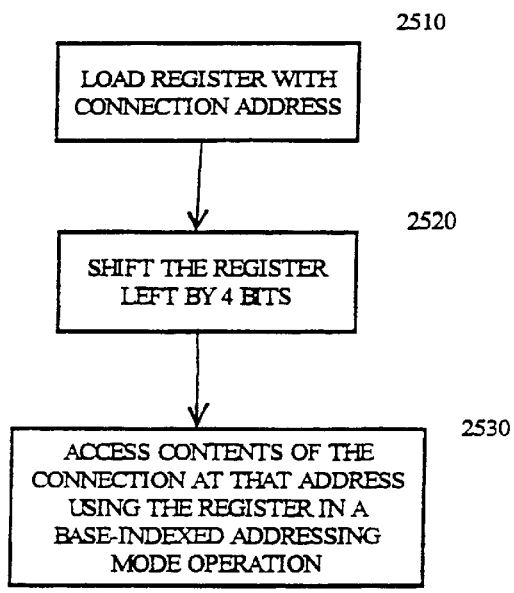
FIG. 25 is a flowchart of the process of accessing data in a dictionary.
FIG. 26 is a section of assembly language code exemplifying the process illustrated in FIG. 25.

Referring now to FIG. 25 which is a flow chart of the shifted memory address access method, and to FIG. 26 which is a sample in an assembly language of this method.

The present invention may be implemented as a system wherein a connection is 16 bytes long consisting of eight fields of two bytes each (making up to 65,536 connections in a dictionary, which may be numbered from 1 to 65,536. This number is called a "connection number" or "connection address" and is not a memory address).

Speed advantages are realised from implementing the present invention in this configuration. When connection addresses are used as code words and when a data structure of the present invention is employed, the time required to access information in a dictionary is reduced. A code word (say 10240) moved into a register 2510 by an instruction such as "movzx edi,ax" is converted into an offset memory address 2520 by a shift operation "shl edi,4" which register then contains the offset memory address 163840 being 10240 multiplied by 16 (the byte length of a connection). The content of connection number 10240 is then available to the processor through the displaced base-index addressing mode 2530, through instructions such as "mov ebx, word ptr [sod+edi+0]" and "mov ebx, word ptr [sod+edi+2]". For example, where the start of a dictionary ("sod") is at memory address 3000000 and the contents of register edi after the above shift operation is 163840, then the first field of connection 10240 resides at memory address 3163840, and its content is available to the processor through instructions such as:

"word ptr [sod+edi+(Fn-1)*2)]"

where Fn is the number of the field in the connection, where "*" means multiplied by, and where the integer result of the computation ((Fn-1)*2) is the value written in the assembly code instruction. For example, in the case of connection field F4, the argument is: "word ptr [sod+edi+6]". Field numbers (F1–F8) are illustrated in FIG. 21. The content of fields are typically further connection numbers, and the process illustrated in FIG. 25 and exemplified in FIG. 26 may be iteratively employed to move at relatively high speed through the internal structures of a dictionary.

This method of the present invention reduces the time required to move from one place to another inside a dictionary, which is a factor influencing compression, adaption and decompression speeds of a coded system; and in the case of a data recognition system, a factor influencing the time required to recognise or not recognise an incoming symbol stream or symbol group. Where an instance of the present invention is further employed in the field of artificial intelligence, this method provides a fast means of emulating in a computer, signal propagation between cells; and in this case, a connection in a dictionary of the present invention may represent a neural connection in a brain, including direction of signal propagation.

Figure 27:
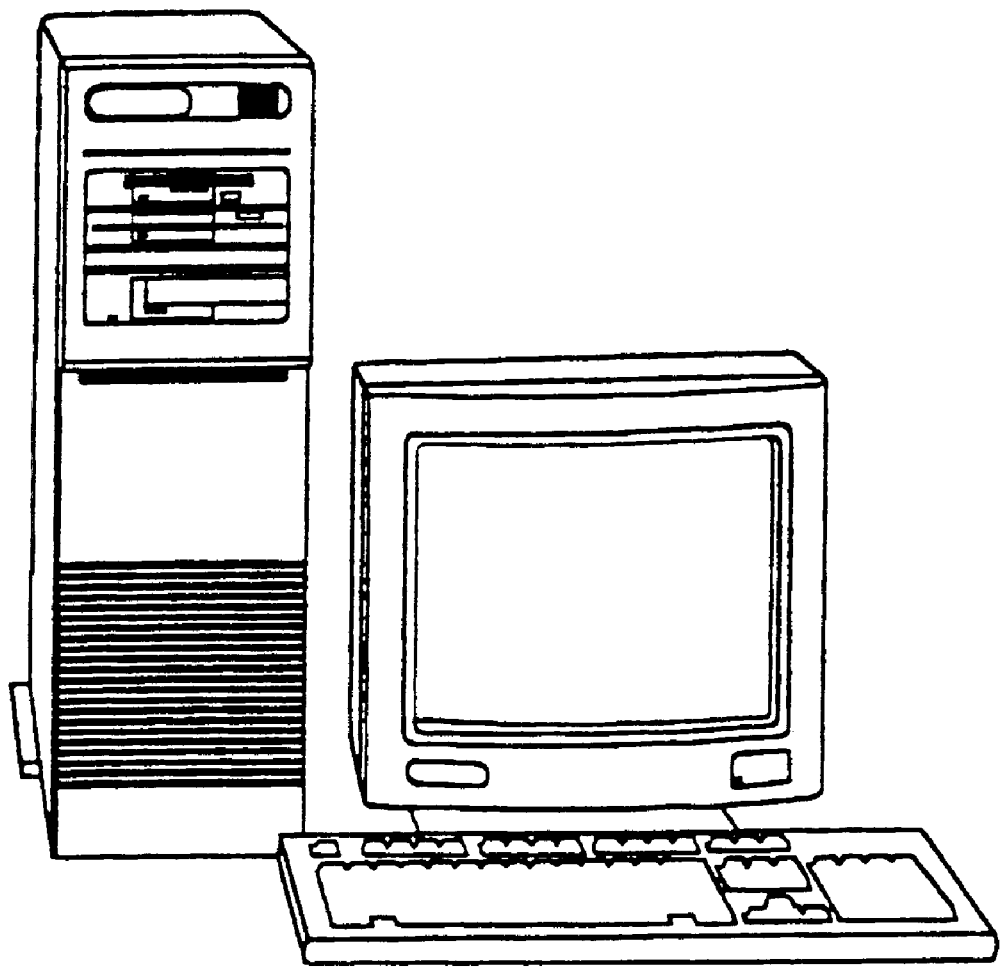
FIG. 27 is a perspective view of a computer system in which the invention might be used.

Referring to FIG. 27 there is shown by way of example only, for completeness of the description, a desktop computer station in which a system incorporating software according to the present invention could be implemented. It will be understood that the system could also be implemented in a wide range of computer or communications equipment or other equipment for the purpose of data storage and compression and for the purpose of manipulation of data where data is held or transmitted in the structure and/or format of the present invention.

Although the specific connections are not shown, the work station comprises a keyboard 10 for user input, which would normally be connected to a processor/disk drive box 11, and in turn to a video display unit 12. Other items of equipment such as data scanner, modem or printer may or may not also be present. The station might also be connected as part of a network and server system. Data entered through the keyboard or downloaded from an external source could be compressed and stored at the station according to the invention. Furthermore, the station and an implementation of the present invention installed in it could be used in part of a system in the field known as artificial intelligence, as the data structure of the present invention which consists in inter-related connections in a dictionary may be used as a computer-representation of connections between neurons in a brain; and compression, adaption and decompression are considered by practitioners in the field of artificial intelligence to be necessary processes of a brain, and an efficient respective data structure, a necessary structure of a brain.

Figure 28:
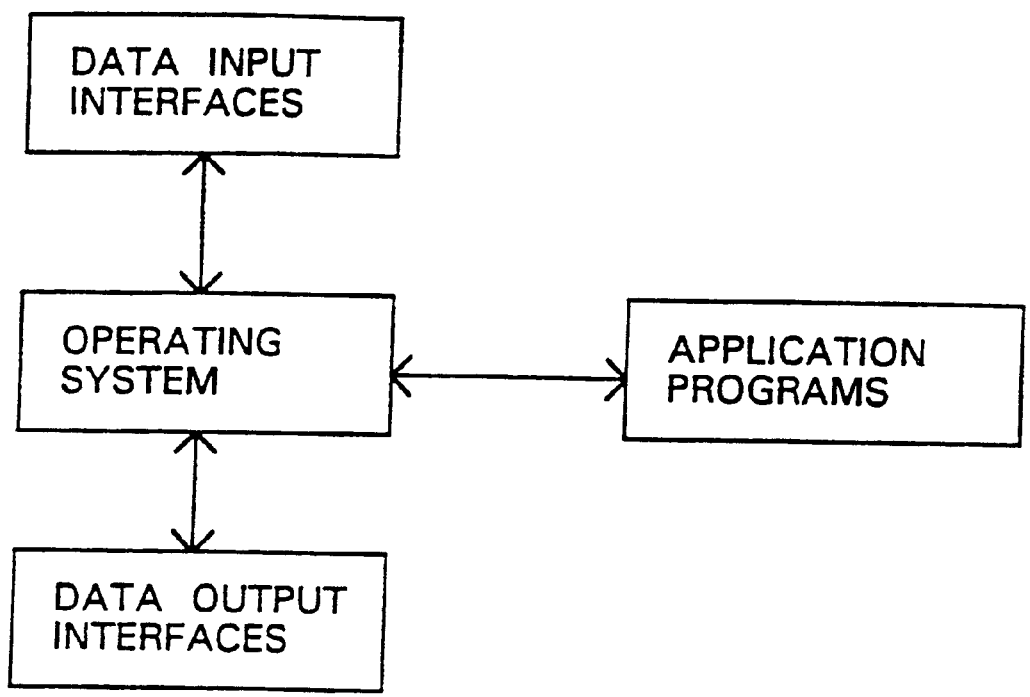
FIG. 28 is a generalized program system which may be implemented in the computer software, hardware or peripheral device of computer station of FIG. 27.

Referring now to FIG. 28 there is shown again by way of example which will be fully appreciated by the skilled person, a generalised software system which may be implemented on the computer station of FIG. 27. The work station is controlled by operating system software 20 which functions in conjunction with a number of application program 23 which may be chosen by a user. Data compression according to the present invention may be implemented as part of the operating system 20 or as a separate application program 23. Data may be input from a variety of sources such as the keyboard or a scanner, through a data input interface 21. Compressed data may be output to an external storage medium such as a disk drive, or transmitted to a remote site, through a data output interface 22.

The particular method of implementing the present invention may vary depending on a number of factors including the particular computer, type(s) of data, programming language, and the intended use of the invention. In adapting the teachings of the present invention to different applications, those of ordinary skill in the art will modify the preferred embodiment described herein. Accordingly, the invention should not be limited by the foregoing description of the preferred embodiment, but rather should be interpreted in accordance with the following claims.

What is claimed is:

1. A method of adapting a connection structure forming part of a dictionary in a computer memory device,
   said structure comprising a plurality of interface connections and a plurality of non-interface connections,
   each interface connection representing a symbol, and the presence or absence of a chain of non-interface connections in which the symbol is represented, and
   each non-interface connection representing a relationship between two symbols, two non-interface connections, a symbol and a non-interface connection, or a non-interface connection and a symbol;
   said method comprising:
      determining alternative relationships between pairs of symbols, non-interface connections, and symbols and non-interface connections within the structure, and
      removing existing non-interface connections from the structure and inserting new non-interface connections into the structure according to relative numbers of occurrences of the alternative relationship within the dictionary.

2. A method of adapting a dictionary comprising a plurality of connection structures stored in computer memory, wherein each structure in the dictionary is adapted according to the method of claim 1.

3. A method according to claim 1 wherein the structure comprises either a linked list chain or binary search chain.

4. A method of adapting a dictionary for use in data compression or decompression comprising:
   receiving a stream of symbols,
   creating and counting a plurality of connections, each connection representing a relationship between symbols and/or symbol groups in the stream, and
   adding new connections to the dictionary for those connections having a number of occurrences greater than a threshold.

5. A method of enabling compression and decompression of symbol streams transmitted between two or more computer devices, comprising:
   creating or storing a dictionary at first and second computer devices,
   adapting the dictionary at the first computer device,
   compressing a symbol stream at the first computer device using the adapted directory,
   transmitting the compressed symbol stream from the first to the second computer device,
   receiving a request at the first computer device from the second computer device for dictionary information relating to the compressed symbol stream, and
   transmitting information relating to the adapted dictionary from the first to the second computer device.

6. A method according to claim 5 wherein:
   the dictionary comprises a plurality of connections, each connection representing a relationship between two symbols, two connections, or a symbol and a connection,
   the adapted dictionary comprises a plurality of connections at least one of which represents a different relationship than any previous connection in the dictionary, and
   the information relating to the adapted dictionary comprises information relating to said at least one different relationship.

7. A dictionary stored in a computer memory device for use in data compression or decompression, comprising:
   a plurality of linked list chains and a plurality of binary search chains,
   each chain of either type comprising a plurality of connections,
   each connection representing an ordered relationship between two symbols, two connections, or a symbol and a connection.

8. A method of operating a shift register in a computer processor device while accessing a connection structure forming part of a dictionary stored in computer memory, comprising:
   loading the register with an item of data stored at an address of a first connection in the structure, and
   shifting the register to convert the item of data into an address of a second connection in the structure.

9. A method according to claim 8 wherein the item of data is a 16 bit word.

10. A method according to claim 8 wherein the register is shifted by 4 bits.

11. A method according to claim 8 further comprising:
   loading the register with an item of data stored at the address of the second connection.

* * * * *

UNITED STATES PATENT AND TRADEMARK OFFICE
CERTIFICATE OF CORRECTION

PATENT NO.      : 6,414,610 B1
DATED           : July 2, 2002
INVENTOR(S)     : Rodney J. Smith It is certified that error appears in the above-identified patent and that said Letters Patent is hereby corrected as shown below:

<u>Column 46,</u>
Line 22, "using the adapted directory," should be -- using the adapted dictionary, --.

Signed and Sealed this

Eleventh Day of February, 2003

JAMES E. ROGAN
*Director of the United States Patent and Trademark Office*